(12) United States Patent
Chen et al.

(10) Patent No.: US 12,396,220 B2
(45) Date of Patent: Aug. 19, 2025

(54) ISOLATION STRUCTURES IN MULTI-GATE FIELD-EFFECT TRANSISTORS

(71) Applicant: Taiwan Semiconductor Manufacturing Company, Ltd., Hsinchu (TW)

(72) Inventors: Ting-Yeh Chen, Hsinchu (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 462 days.

(21) Appl. No.: 17/879,520

(22) Filed: Aug. 2, 2022

(65) Prior Publication Data
US 2024/0047518 A1    Feb. 8, 2024

(51) Int. Cl.
*H10D 62/10* (2025.01)
*H01L 21/28* (2025.01)
*H10D 64/01* (2025.01)

(52) U.S. Cl.
CPC ..... *H10D 62/115* (2025.01); *H01L 21/28194* (2013.01); *H10D 64/017* (2025.01); *H10D 64/021* (2025.01)

(58) Field of Classification Search
CPC .. H10D 62/115; H10D 62/121; H10D 62/151; H10D 64/017; H10D 64/021; H10D 30/797; H10D 30/014; H10D 30/43; H10D 30/6735; H10D 30/6757; H01L 21/28194
See application file for complete search history.

(56) References Cited

U.S. PATENT DOCUMENTS

| | | | |
|---|---|---|---|
| 10,573,755 B1* | 2/2020 | Frougier | H10D 30/6743 |
| 2018/0315817 A1* | 11/2018 | Van Dal | H10D 84/0193 |
| 2020/0273964 A1* | 8/2020 | Lin | H10D 62/116 |
| 2021/0202709 A1* | 7/2021 | Lee | H10D 30/6735 |
| 2021/0265481 A1 | 8/2021 | Huang et al. | |
| 2021/0272848 A1 | 9/2021 | Chu et al. | |
| 2021/0273103 A1 | 9/2021 | Chen et al. | |
| 2021/0305408 A1 | 9/2021 | Yu et al. | |
| 2021/0336033 A1 | 10/2021 | Huang et al. | |
| 2022/0293730 A1* | 9/2022 | Kim | H10D 64/015 |
| 2025/0113513 A1* | 4/2025 | Yeung | H10D 30/6735 |

FOREIGN PATENT DOCUMENTS

| | | |
|---|---|---|
| CN | 107154384 A | 9/2017 |
| TW | 202205460 A | 2/2022 |

* cited by examiner

*Primary Examiner* — Dao H Nguyen
(74) *Attorney, Agent, or Firm* — HAYNES AND BOONE, LLP

(57) ABSTRACT

A method includes providing a structure having a substrate, fins and an isolation structure over the substrate, wherein each fin includes first and second semiconductor layers alternatingly stacked. The method further includes depositing a first dielectric layer over top and sidewalls of the fins and over a top surface of the isolation structure; depositing a second dielectric layer over the first dielectric layer; and etching back the first and the second dielectric layers such that they remain on the top surface of the isolation structure and are removed from the top and sidewalls of the fins. The method further includes forming dummy gate stacks, gate spacers, source and drain trenches, and inner spacers, wherein the first and the second dielectric layers remain on the top surface of the isolation structure.

20 Claims, 25 Drawing Sheets

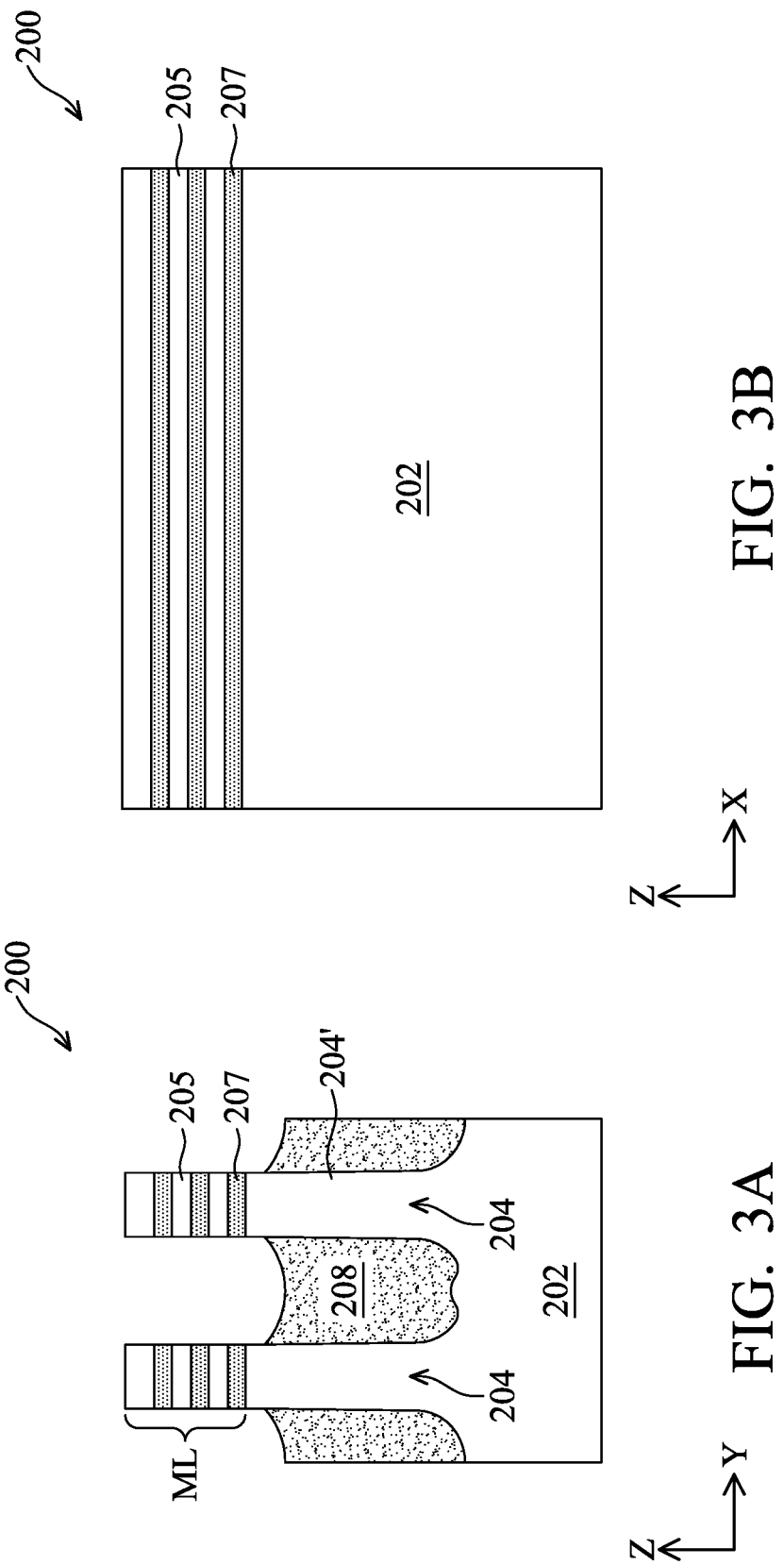

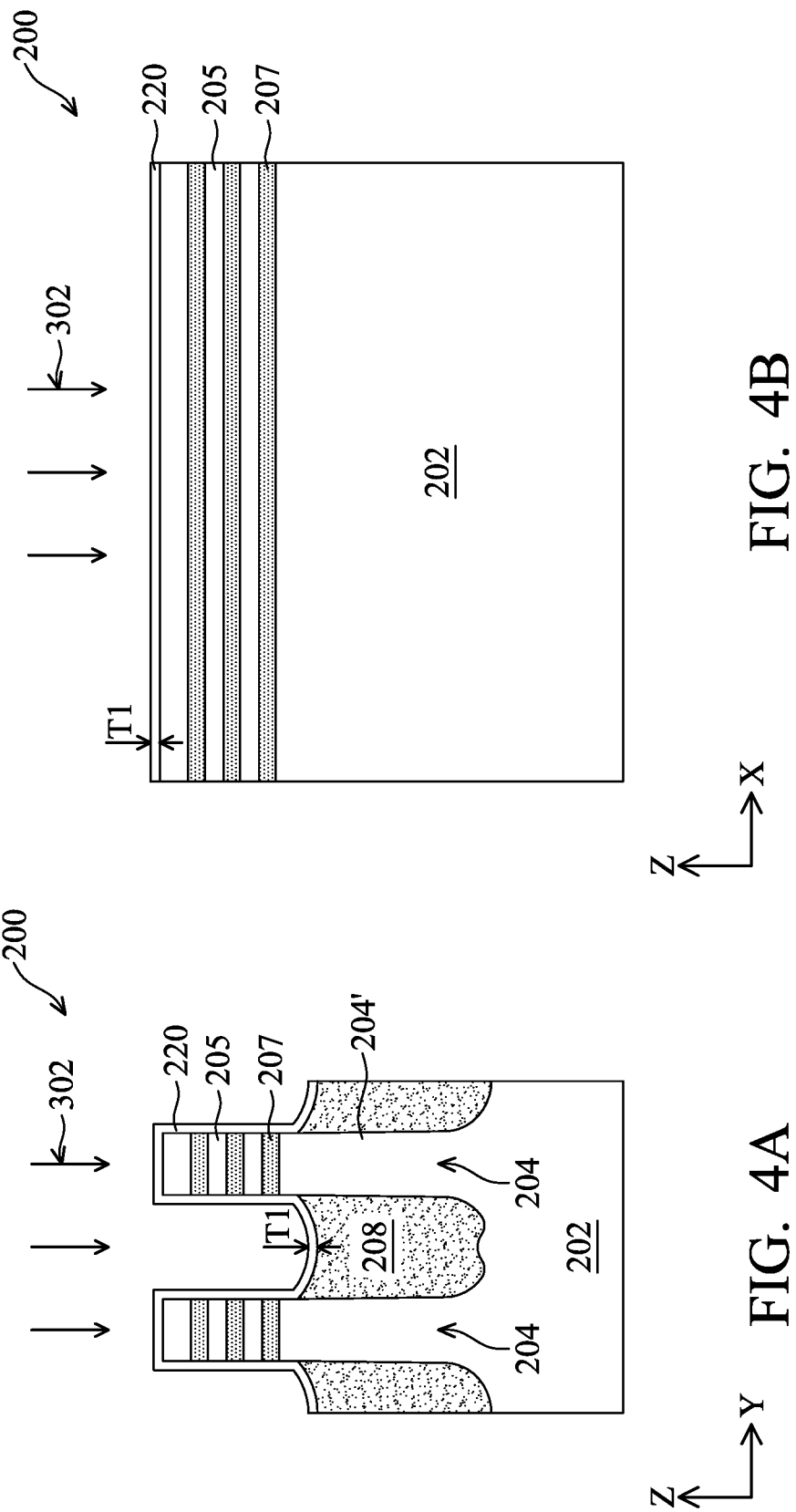

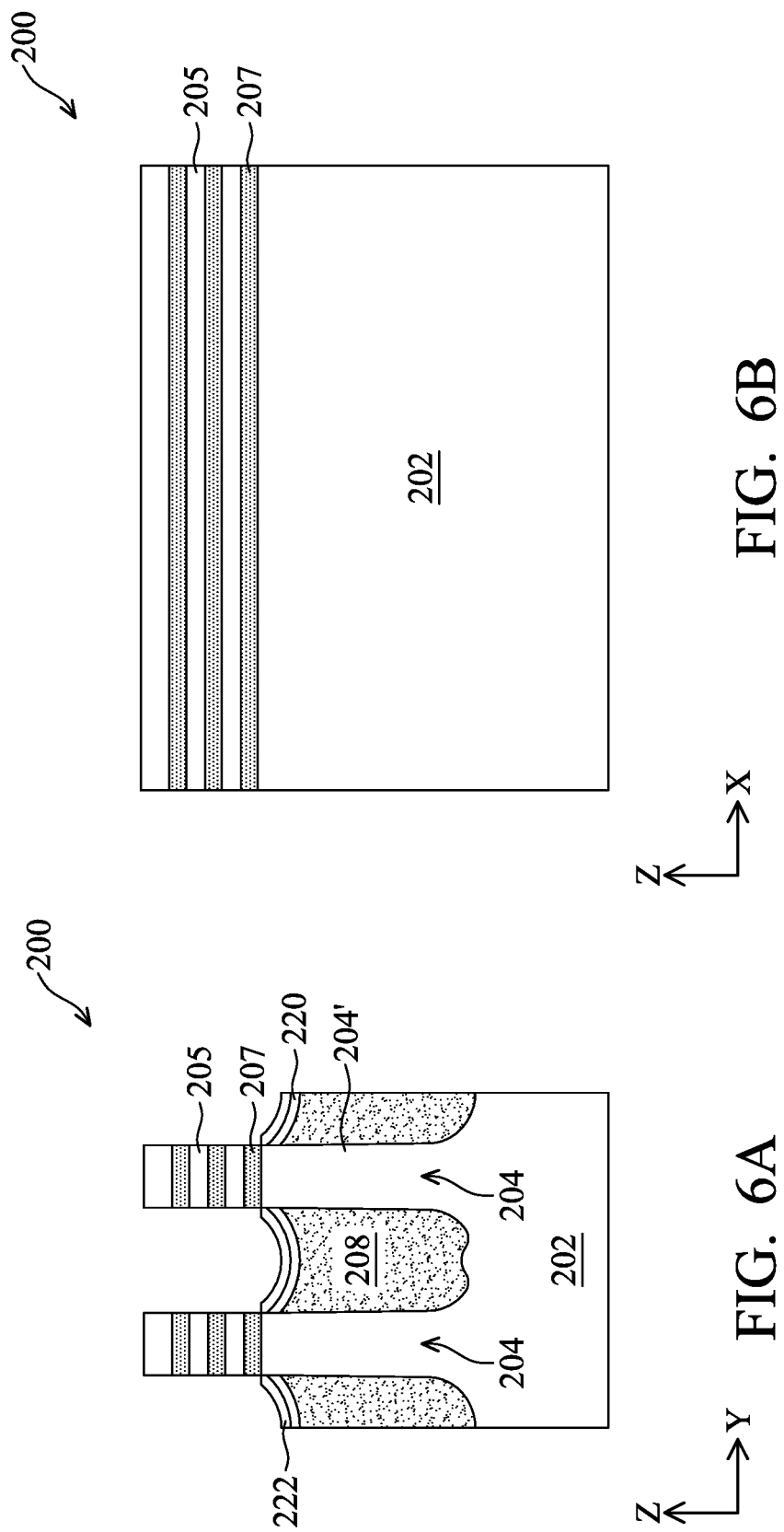

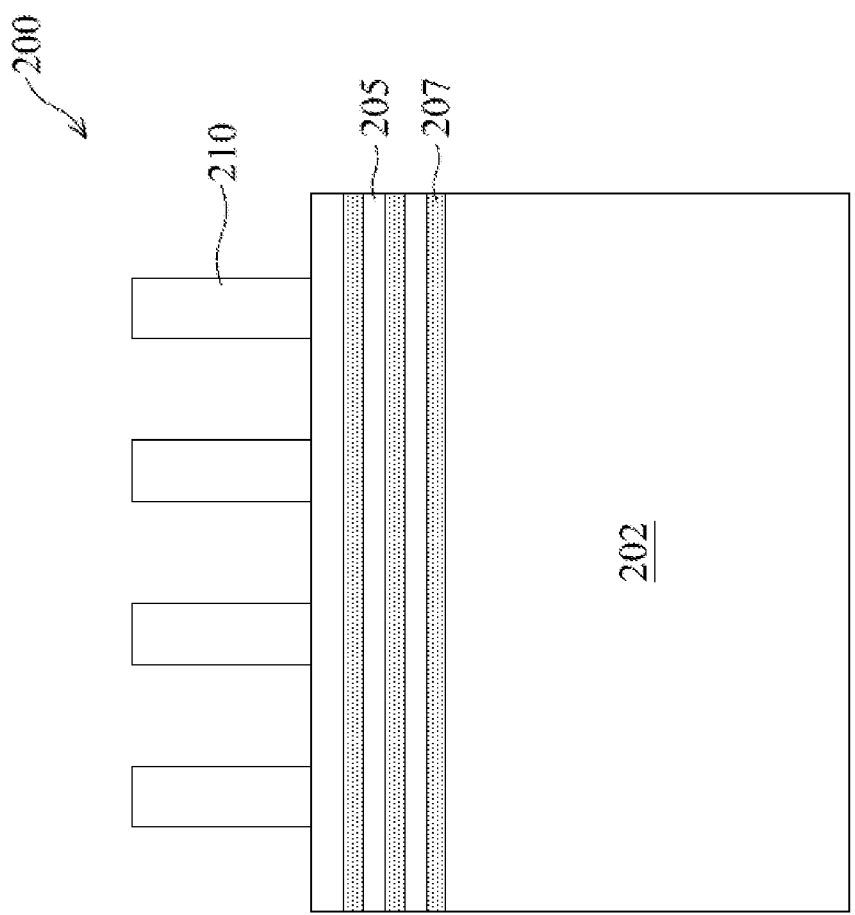
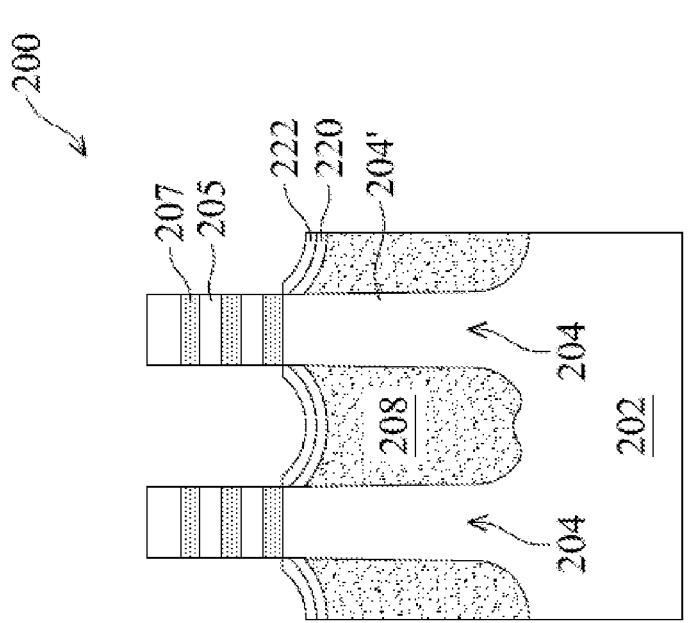
FIG. 7A
FIG. 7B

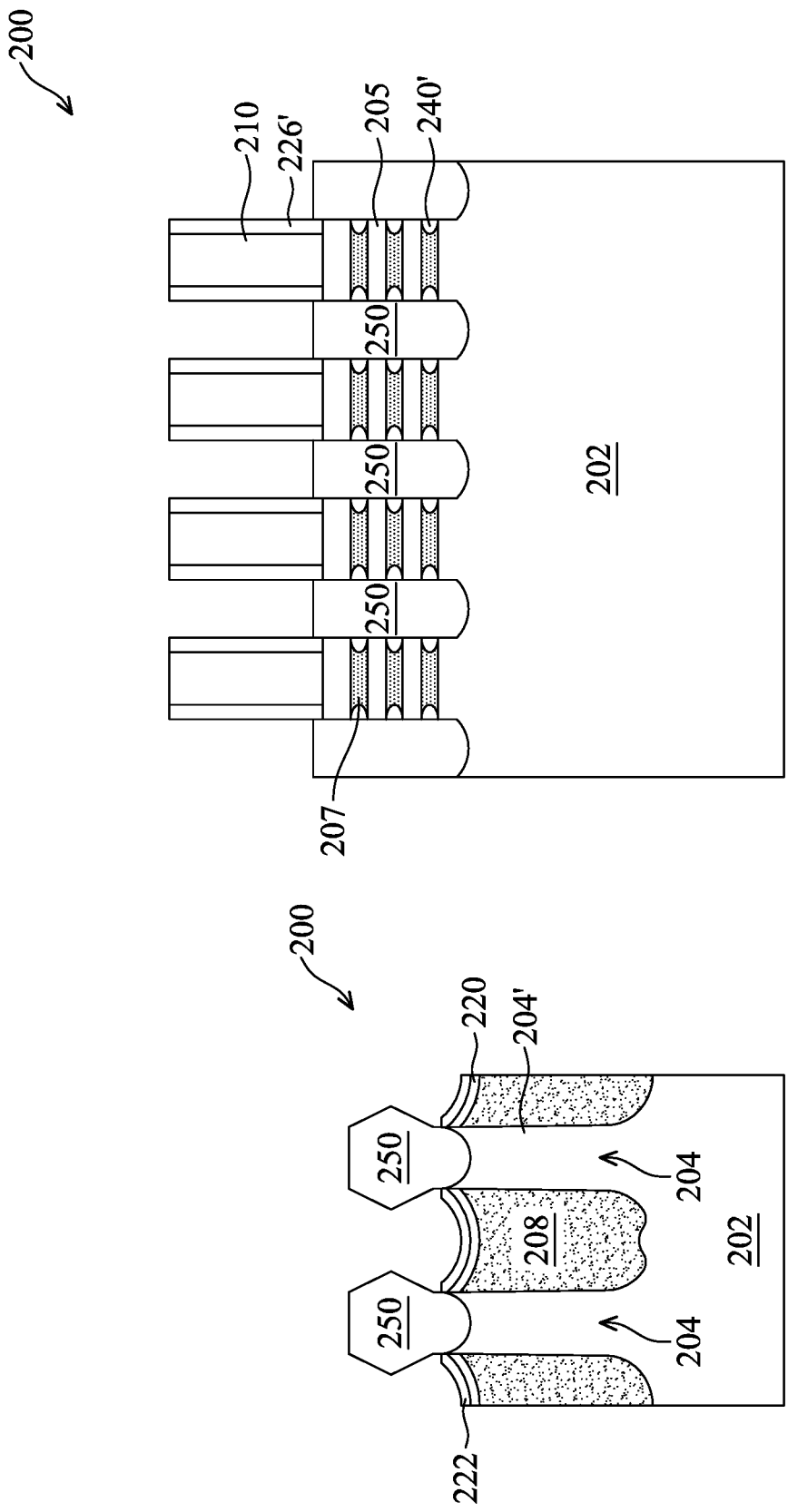

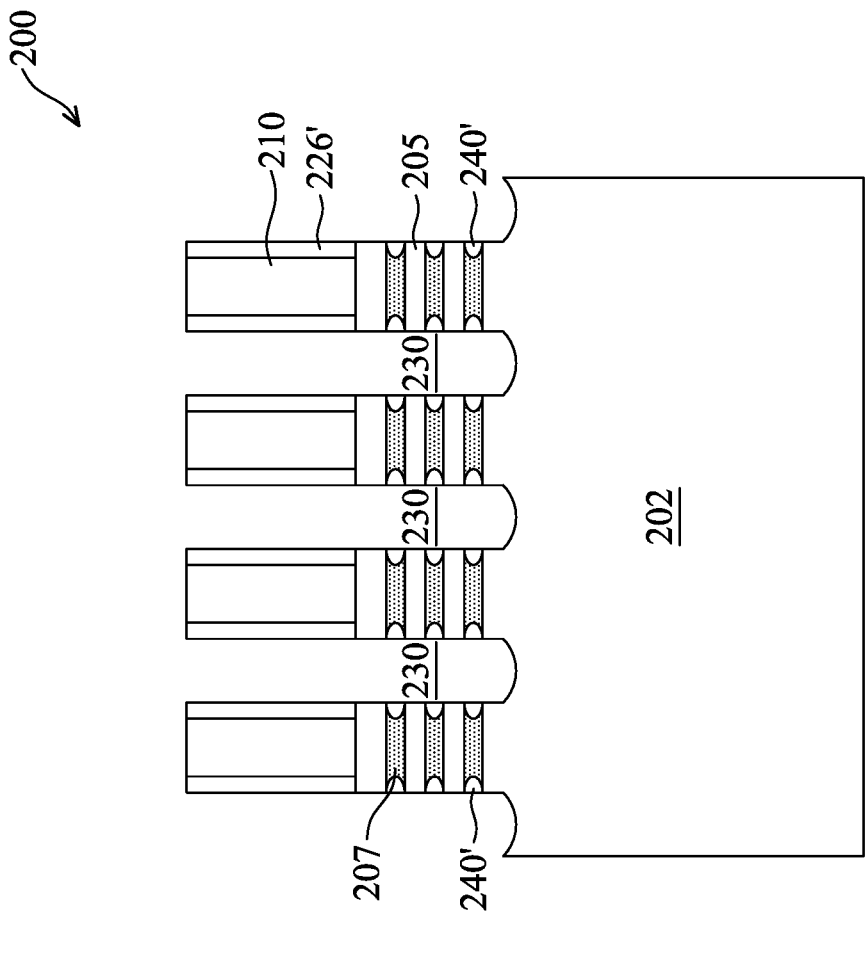
FIG. 21B
FIG. 21A

ISOLATION STRUCTURES IN MULTI-GATE FIELD-EFFECT TRANSISTORS

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) field-effect transistors (FETs), have been incorporated into various memory and logic devices to reduce IC chip footprint while maintaining reasonable processing margins. In some implementations, isolation structures (e.g., shallow trench isolation or STI) in GAA FETs may be formed with silicon oxide deposited using flowable chemical vapor deposition (CVD). Such isolation structures may be vulnerable to dry etching and wet cleaning processes that are frequently utilized in forming GAA FETs. As a result, the isolation structures may be over-etched, leading to excessive junction leakage. Thus, for at least this reason, improvements in methods of forming isolation structures for mitigating junction leakage issues in GAA FETs are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, and 15A are cross-sectional views of the semiconductor device shown in FIG. 2, along the B-B' line of FIG. 2, at intermediate stages of the example methods of FIGS. 1A-1B according to various embodiments of the present disclosure.

FIGS. 3B, 4B, 5B, 6B, 7B, 8B, 9B, 10B, 11B, 12B, 13B, 14B, and 15B are cross-sectional views of the semiconductor device shown in FIG. 2, along the C-C' line of FIG. 2, at intermediate stages of the example methods of FIGS. 1A-1B according to various embodiments of the present disclosure.

FIGS. 17A, 18A, 19A, 20A, 21A, 22A, and 23A are cross-sectional views of the semiconductor device shown in FIG. 2, along the B-B' line of FIG. 2, at intermediate stages of the example methods of FIGS. 16A-16B according to various embodiments of the present disclosure.

FIGS. 17B, 18B, 19B, 20B, 21B, 22B, and 23B are cross-sectional views of the semiconductor device shown in FIG. 2, along the C-C' line of FIG. 2, at intermediate stages of the example methods of FIGS. 16A-16B according to various embodiments of the present disclosure.

DETAILED DESCRIPTION

Figure 1A:
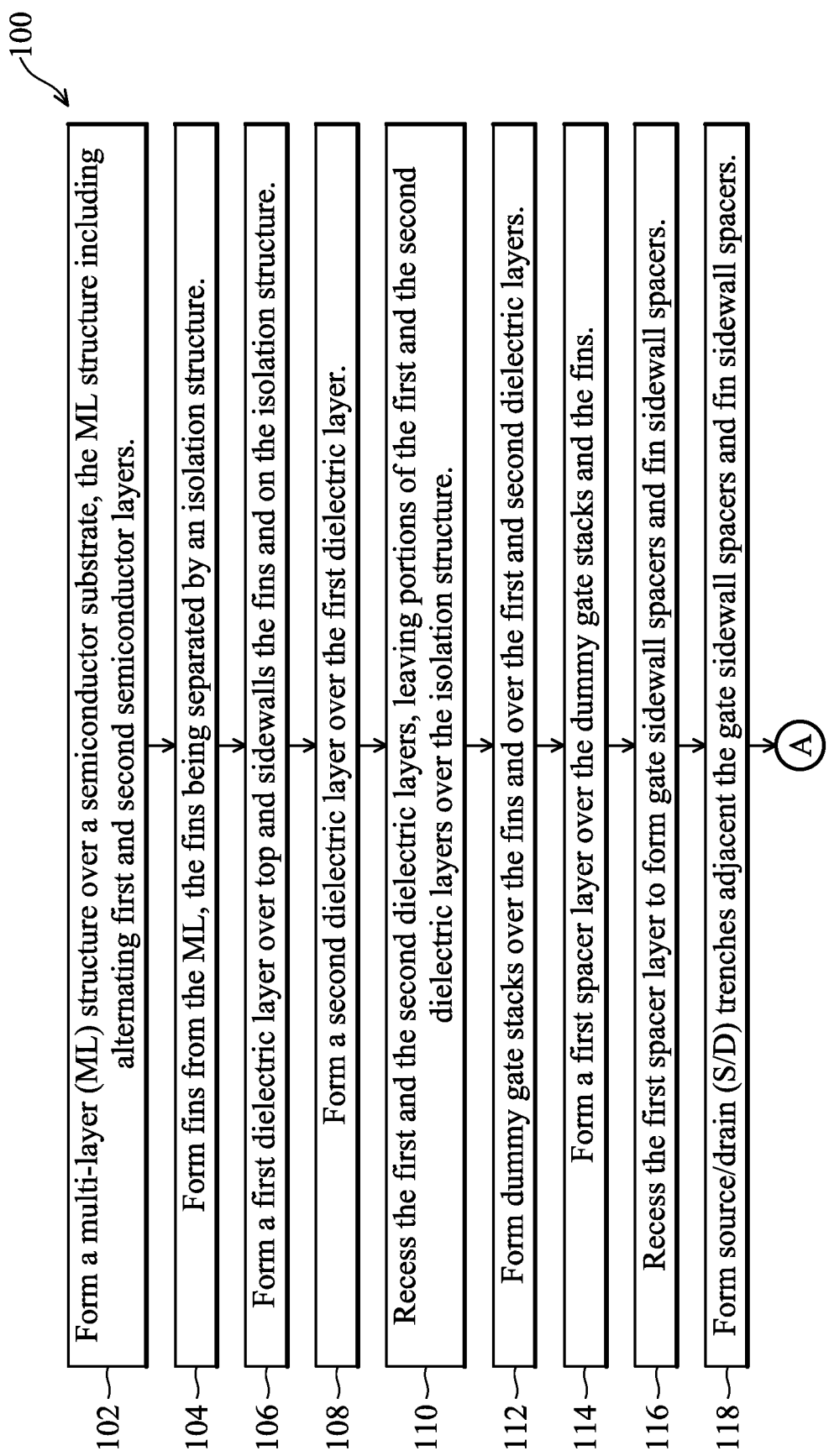
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, same reference numerals may be used to refer to same or similar structures in various embodiments.

The present disclosure is generally directed to structures of and methods of forming multi-gate metal-oxide-semiconductor field-effect transistors (MOSFETs or FETs in the present disclosure), such as gate-all-around (GAA) FETs. More specifically, the present disclosure is directed to structures of and methods of forming isolation structures for GAA FETs. The GAA FETs provided herein may be nanosheet-based FETs, nanowire-based FETs, and/or nanorod-based FETs. In other words, the present disclosure does not limit the GAA FETs to have a specific configuration.

Generally, the channel region of a GAA FET includes a stack of silicon-based channel layers (Si layers) interleaved with a metal gate structure. While such structures are generally adequate for maintaining performance of the GAA devices, they are not entirely satisfactory in all aspects. For example, in some implementations, isolation structures (e.g., shallow trench isolation or STI) in GAA FETs may be formed with silicon oxide deposited using flowable chemical vapor deposition (CVD). Such isolation structures may be vulnerable to dry etching and wet cleaning processes that are frequently utilized in forming GAA FETs. As a result, the isolation structures may be over-etched, leading to excessive junction leakage. The present embodiments provide methods of forming an isolation structure for GAA FETs that mitigates the junction leakage issues.

Referring now to FIGS. 1A-1B and 16A-16B, flowchart of method 100 and method 150 of forming a semiconductor device (hereafter referred to as the device) 200 are illustrated according to various aspects of the present disclosure. Methods 100 and 150 are merely examples and are not intended to limit the present disclosure beyond what is explicitly recited in the claims. Additional operations can be provided before, during, and after methods 100 and 150, and some operations described can be replaced, eliminated, or moved around for additional embodiments of each method. Methods 100 and 150 are described below in conjunction with FIGS. 2-15B and 17A-23B. Specifically, FIG. 2 illustrates a three-dimensional perspective view of the device 200 at intermediate stages of the methods 100 and/or 150; FIGS. 3A, 4A, 5A, 6A, 7A, 8A, 9A, 10A, 11A, 12A, 13A, 14A, 15A, 17A, 18A, 19A, 20A, 21A, 22A, and 23A are cross-sectional views of the device 200 shown in FIG. 2 taken along line B-B' at intermediate stages of the methods 100 and/or 150; and FIGS. 3B, 4B, 5B, 6B, 7B, 8B, 9B, 10B, 11B, 12B, 13B, 14B, 15B, 17B, 18B, 19B, 20B, 21B, 22B, and 23B are cross-sectional views of the device 200 shown in FIG. 2 taken along line C-C' at intermediate stages of the methods 100 and/or 150.

The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, MOSFETs, CMOSFETs, bipolar transistors, high voltage transistors, high frequency transistors, and/or other transistors. The present disclosure is not limited to any particular number of devices or device regions, or to any particular device configurations. Additional features can be added to the device 200, and some of the features described below can be replaced, modified, or eliminated in other embodiments of the device 200.

Referring to FIGS. 1A, 2, 3A, and 3B, method 100 at operation 102 provides a semiconductor substrate (hereafter referred to as "the substrate") 202 and subsequently forms a multilayered structure (ML) thereover. The substrate 202 may include an elemental (i.e., having a single element) semiconductor, such as silicon (Si), germanium (Ge), or other suitable materials; a compound semiconductor, such as silicon carbide, gallium arsenic, gallium phosphide, indium phosphide, indium arsenide, indium antimonide, other suitable materials, or combinations thereof; an alloy semiconductor, such as SiGe, GaAsP, AlInAs, AlGaAs, GaInAs, GaInP, GaInAsP, other suitable materials, or combinations thereof. The substrate 202 may be a single-layer material having a uniform composition. Alternatively, the substrate 202 may include multiple material layers having similar or different compositions suitable for manufacturing the device 200.

In some examples, various doped regions may be formed in or on the substrate 202. These regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques.

In the present embodiments, the ML includes alternating non-channel layers 207 and channel layers 205 arranged in a vertical stack along the Z axis. In some embodiments, each channel layer 205 includes a semiconductor material such as, for example, Si, Ge, SiC, SiGe, GeSn, SiGeSn, SiGeCSn, other suitable semiconductor materials, or combinations thereof, while each non-channel layer 207 is a sacrificial layer having a different composition from that of the channel layer 205. In an example, the channel layer 205 may include elemental Si but is free, or substantially free, of Ge, and the non-channel layer may include SiGe. In another example, the channel layer 205 and the non-channel layer 207 both include SiGe but with different Si:Ge atom ratios. In some examples, the device 200 may each include three to ten pairs of alternating channel layers 205 and non-channel layer 207. Other configurations may also be applicable depending upon specific design requirements. In the present embodiments, a sheet (or wire) release process may be implemented to remove the non-channel layers 207 after forming epitaxial source/drain (S/D) regions (or S/D features) to form multiple openings between the channel layers 205, and a metal gate structure (such as a high-k metal gate) is subsequently formed in the openings to complete fabrication of the FET. Here, "S/D" may refer to a source or a drain, individually or collectively dependent upon the context.

In the present embodiments, forming the ML includes alternatingly growing a SiGe layer (i.e., the non-channel layer 207) and a Si layer (i.e., the channel layer 205) in a series of epitaxy growth processes implementing chemical vapor deposition (CVD) techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process may use a gaseous and/or liquid precursor that interacts with the composition of the underlying substrate. For example, the substrate 202, which includes Si, may interact with a Ge-containing precursor to form the non-channel layer 207. In some examples, the channel layers 205 and the non-channel layers 207 may be formed into nanosheets, nanowires, or nanorods.

Still referring to FIGS. 1A and 2-3B, method 100 at operation 104 forms fins (or fin structures) 204 extending from the substrate 202. In the depicted embodiments, the fins 204 are oriented lengthwise along the X axis. Depending on the conductivity type of the resulting FET, the fin 204 may be formed in a region of the substrate 202 doped with a p-type dopant (i.e., a p-well structure) to form an NFET, or formed in a region of the substrate 202 doped with an n-type dopant (i.e., an n-well structure) to form a PFET. It is noted that embodiments of the device 200 may include many fins (semiconductor fins) disposed over the substrate 202 configured to provide one or more NFETs and/or PFETs.

In the present embodiments, each fin 204 includes the ML disposed over a base fin 204', where the base fin 204' protrudes from the substrate 202. The fins 204 may be fabricated using suitable processes such as double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

Still referring to FIGS. 1A and 2-3B, method 100 at operation 104 forms an isolation structure 208 over the substrate 202 and surrounding bottom portions of the fins 204. The isolation structure 208 may include silicon oxide ($SiO_2$), fluorine-doped silicon oxide (FSG), a low-k dielectric material, other suitable materials, or combinations thereof. In some embodiments, the isolation structure 208 may include a multi-layer structure. In the present embodiments, the isolation structure 208 includes shallow trench isolation (STI) features. In the embodiments, the isolation structure 208 is formed by depositing a dielectric layer, such as a silicon oxide layer, over the substrate 202, thereby filling trenches between adjacent fins 204, and subsequently recessing the dielectric layer such that a top surface of the isolation structure 208 is below a top surface of the fins 204 or below a top surface of the base fins 204'. The isolation structure 208 may be deposited by any suitable method, such as CVD, flowable CVD (FCVD), spin-on-glass (SOG), other suitable methods, or combinations thereof. In some embodiments, the isolation structure 208 is formed to a thickness of about 80 nm to about 150 nm. Other isolation structures such as field oxide, local oxidation of silicon (LOCOS), other suitable structures, or combinations thereof may also be implemented as the isolation structure 208. In some embodiments, recessing the dielectric layer is controlled such that portions of the isolation structure 208 remain on sidewalls of the base fin 204' (and/or the ML) below the ML. This is to ensure that no semiconductor material (e.g., elemental Si in the base fin 204') is exposed.

Figure 2:
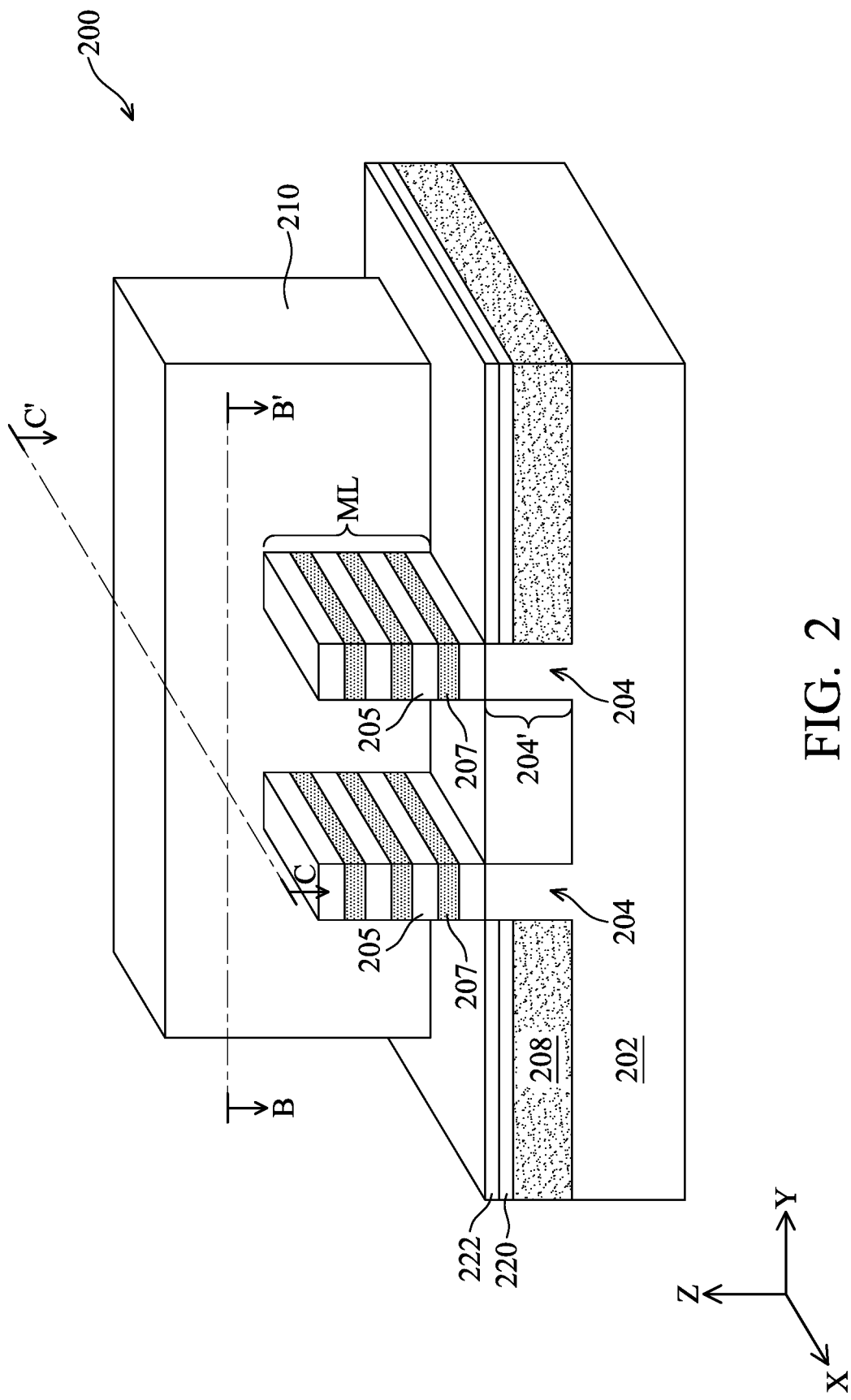
FIG. 2 is a three-dimensional perspective view of an example semiconductor device according to various embodiments of the present disclosure.

Referring to FIGS. 1A and 4A-4B, method 100 at operation 106 forms a dielectric layer 220 over the device 200 by a deposition process. In the present embodiments, the dielectric layer 220 is formed over a top surface of the isolation structure 208 and on top and sidewall surfaces of the fins 204. Furthermore, the dielectric layer 220 is configured with a composition different from that of the isolation structure 208. In an embodiment, the dielectric layer 220 includes a dielectric material (matrix) doped with carbon atoms (impurities). In some embodiments, the dielectric material has a composition similar to that of the isolation structure 208. For example, the dielectric material may include silicon oxide (SiO and/or $SiO_2$), such that the dielectric layer 220 comprises carbon-doped silicon oxide (SiOC). In some embodiments, the dielectric material has a composition different from the isolation structure 208. For example, the dielectric material may include silicon nitride, such that the dielectric layer 220 comprises carbon-doped silicon nitride (SiCN). In some embodiments, the carbon included in the dielectric layer 220 is in the form of polycrystalline carbon with an average crystal size ranging from about 0.5 nm to about 3 nm.

The deposition process 302 may be any suitable process, such as a chemical vapor deposition (CVD) process, an atomic layer deposition process (ALD) process, other suitable processes, or combinations thereof. In the present embodiments, the deposition process is a CVD process during which carbon atoms are doped in-situ via an implantation process or a diffusion process. Parameters such as energy of implantation, dosage of the dopant species (i.e., oxygen), angle of implantation, and/or other suitable parameters may be adjusted to achieve the desired implantation results. In some embodiments, the implantation process is implemented at an energy of about 1 keV to about 2 keV and a dosage of about $1E17$ $cm^{-3}$ to about $1E19$ $cm^{-3}$. In the present embodiments, the dielectric layer 220 is formed to a thickness Ti of about 2 nm to about 5 nm. In some embodiments, as a result of the implantation the carbon atoms penetrate below a top surface of the ML for a distance of about 3 nm to about 30 nm, though the distribution of the carbon atoms decreases as the distance increases.

Figure 5A:
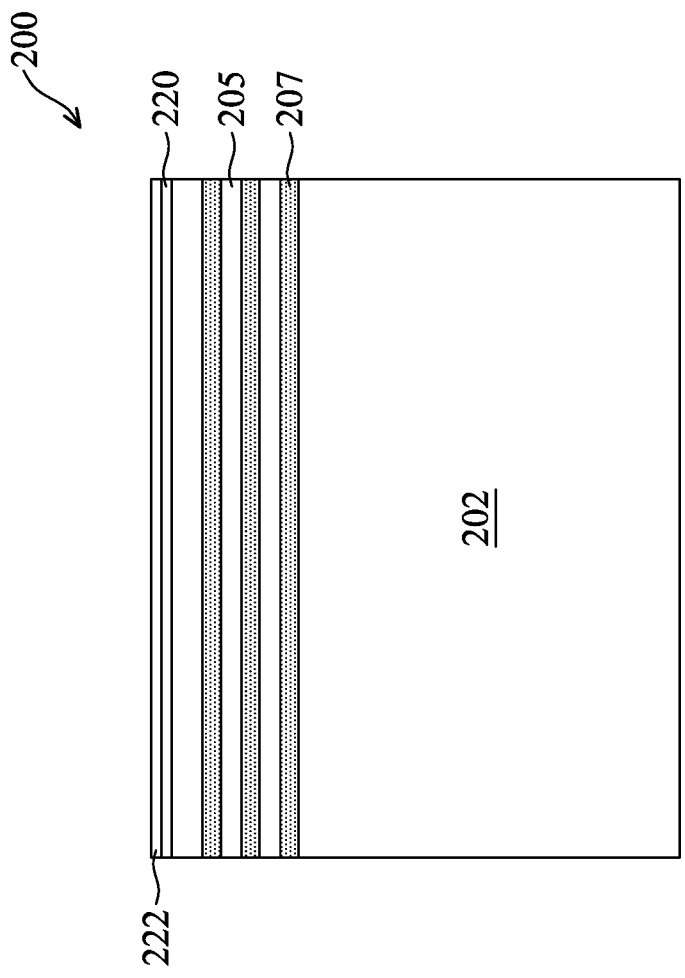
Figure 5B:
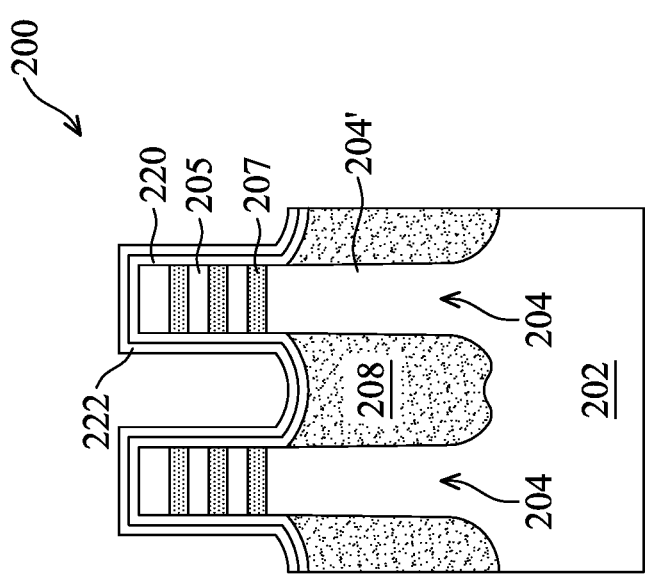

Referring to FIGS. 1A and 5A-5B, method 100 at operation 108 forms a dielectric layer 222 over the device 200 by a deposition process. In the present embodiments, the dielectric layer 222 is formed over the dielectric layer 220 and on top and sidewall surfaces of the fins 204. In an embodiment, the dielectric layer 222 is configured with a composition different from that of the dielectric layer 220 and the isolation structure 208. In an embodiment, the dielectric layer 222 includes silicon nitride. In an embodiment, the dielectric layer 222 has a thickness of about 4 nm to about nm.

Referring to FIGS. 1A and 6A-6B, method 100 at operation 110 recesses the dielectric layer 222 and the dielectric layer 220. In the present embodiment, the method 100 applies an etching process that is tuned (e.g., by tuning the etching power, pressure, etc.) such that the dielectric layers 222 and 220 are removed from the top and sidewall surfaces of the fins 204 above the isolation structure 208 and are not removed or are insignificantly removed from the top surface of the isolation structure 208, such as shown in FIG. 6A. In other words, the dielectric layers 222 and 220 are removed from surfaces of the channel layer 205 and the non-channel layer 207 but remain on the top surface of the isolation structure 208. In an embodiment, operation 110 includes applying a power in a range of about 100 W to 250 W and a pressure in a range of about 40 torr to about torr during the etching process. Such etching condition results in the dielectric layers 220 and 222 being kept on the top surface of the isolation structure 208 while they are removed from the top and sidewalls of the fins 204. The thickness of the remaining portion of the dielectric layer 220 is about 2 nm to about 5 nm. The thickness of the remaining portion of the dielectric layer 222 may be slightly less than what is initially deposited and is in a range of about 4 nm to about 10 nm. As will be discussed, the remaining portions of the dielectric layers 222 and 220 protect the isolation structure 208 from subsequent etching processes, which in turn reduces junction leakage in the device 200.

Referring to FIGS. 1A and 7A-7B, method 100 at operation 112 forms dummy gate stacks (i.e., placeholder gates) 210 over the channel region of each of the fins 204 and over the dielectric layer 222. In the present embodiments, the dummy gate stacks 210, which include polysilicon, will be replaced with high-k metal gates 260 (see FIG. in subsequent fabrication. Here, "high-k" refers to a dielectric material having a dielectric constant greater than that of silicon oxide, which is about 3.9. The dummy gate stacks 210 may be formed by a series of deposition and patterning processes. For example, the dummy gate stacks 210 may be formed by depositing a polysilicon layer over the fins 204 and the dielectric layer 222, and subsequently performing an anisotropic etching process (e.g., a dry etching process), leaving portions of the polysilicon over the channel regions of the fins 204. The dummy gate stacks 210 may further include an interfacial layer (not depicted separately) and a gate dielectric layer (not depicted separately) under the polysilicon layer.

Figure 8A:
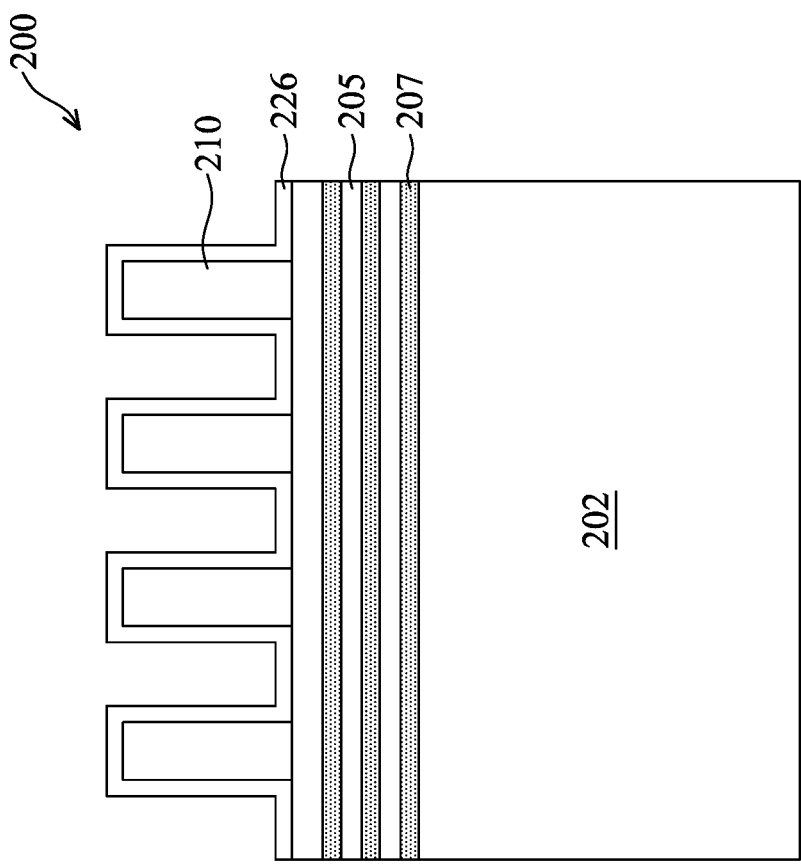
Figure 8B:
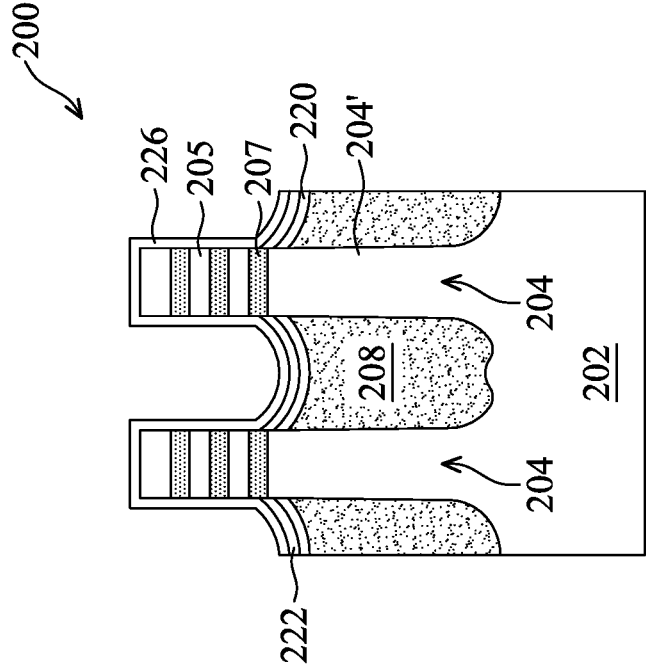

Referring to FIGS. 1A and 8A-8B, method 100 at operation 114 deposits one or more dielectric layers (or spacer layers) 226 over the dielectric layer 222, the fins 204 (specifically the channel layers 205 and the non-channel layers 207), and the dummy gate stacks 210. Particularly, the one or more dielectric layers 226 are deposited over the top and sidewall surfaces of the fins 204 and over the top and sidewall surfaces of the dummy gate stacks 210. The one or more dielectric layers 226 may include silicon oxide, silicon nitride, silicon oxynitride (SiON), silicon carbide, silicon carbon nitride (SiCN), silicon oxycarbide (SiOC), silicon oxycarbon nitride (SiOCN), carbon doped oxide, nitrogen doped oxide, porous oxide, or a combination thereof. The one or more dielectric layers 226 may be deposited using CVD or other suitable methods. In an embodiment, the one or more dielectric layers 226 include a layer of silicon nitride having a thickness in a range of about 8 nm to about 12 nm.

Figure 9B:
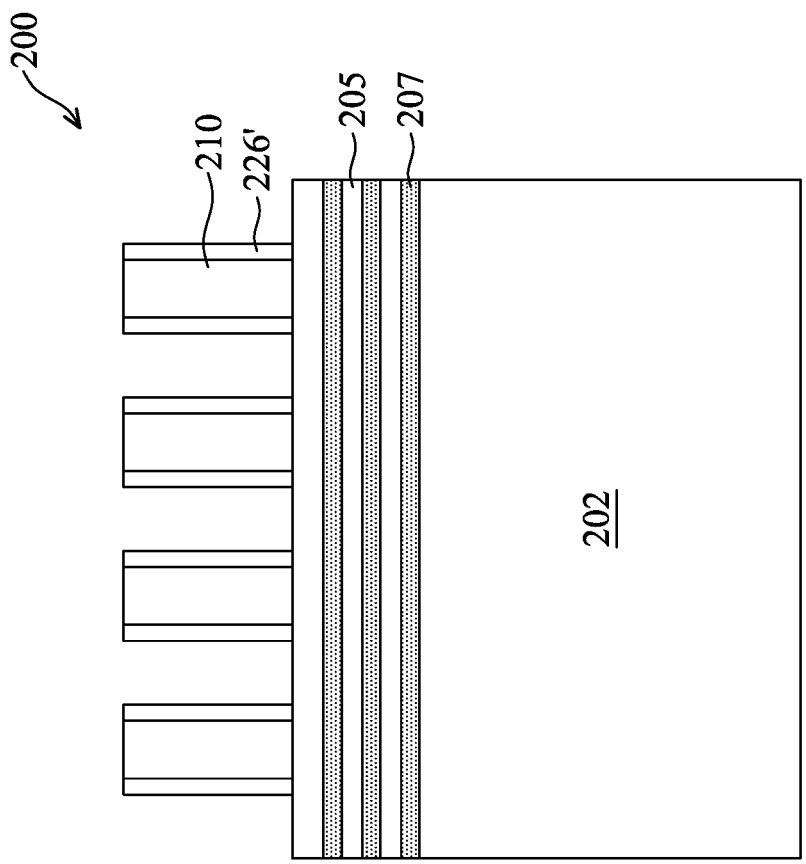
Figure 9A:
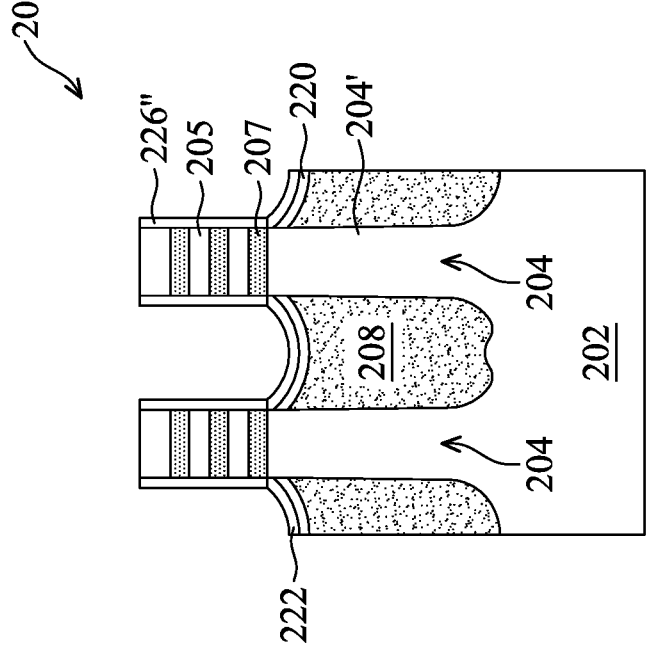

Referring to FIGS. 1A and 9A-9B, method 100 at operation 116 etches the one or more dielectric layers 226 using one or more anisotropic etching processes. As a result, portions of the one or more dielectric layers 226 on the dielectric layer 222, on the top surfaces of the fins 204, and on the top surfaces of the dummy gate stacks 210 are removed. Portions of the one or more dielectric layers 226 remain on the sidewall surfaces of the dummy gate stacks 210, which are referred to as gate sidewall spacers 226'. Portions of the one or more dielectric layers 226 remain on the sidewall surfaces of the fins 204, which are referred to as fin sidewall spacers 226".

Figure 10A:
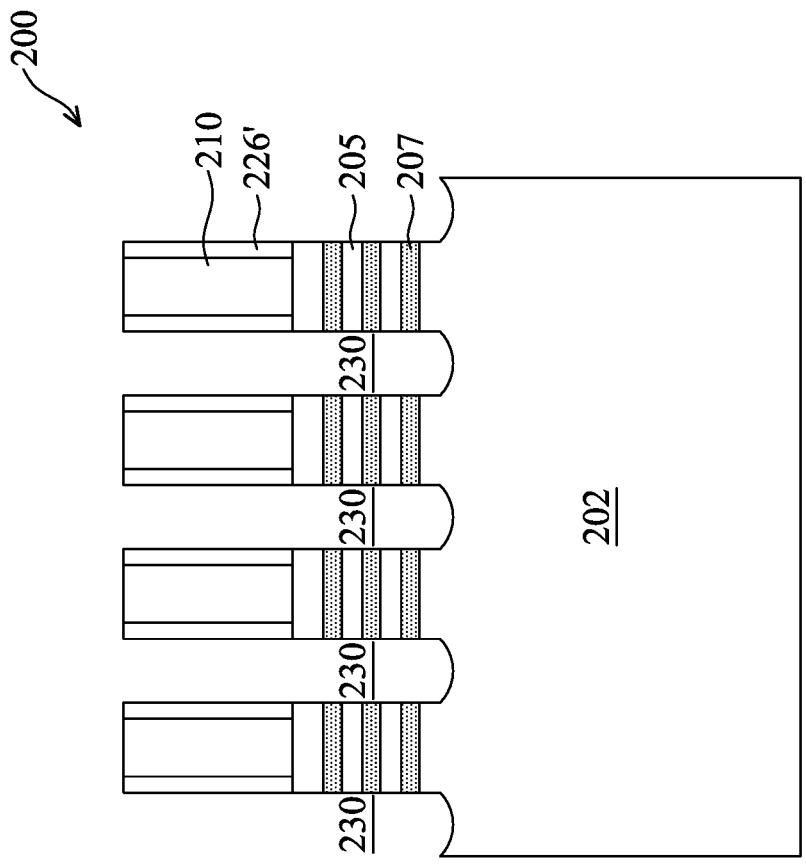
Figure 10B:
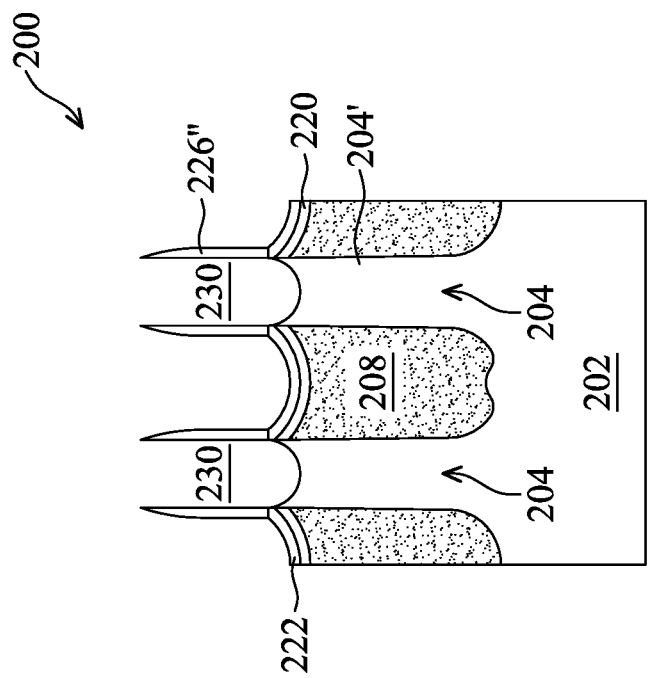

Referring to FIGS. 1A and 10A-10B, method 100 at operation 118 forms S/D recesses (or S/D trenches) 230 in the S/D regions of the fins 204 adjacent the gate sidewall spacers 226' and fin sidewall spacers 226". In the present embodiments, method 100 removes portions of the ML in the S/D regions of the fins 204 by an etching process, which may be a dry etching process, a wet etching process, RIE, or combinations thereof. A cleaning process may subsequently be performed to remove any etching residues in the S/D recesses 230 with HF and/or other suitable solvents. In the present embodiments, method 100 at operation 118 implements an etchant configured to remove the channel layers 205 and the non-channel layers 207 without removing, or substantially removing, the dielectric layer 222, such that at least a portion of the dielectric layer 222 remains over the isolation structure 208. Further, the dielectric layer 220 remains under the dielectric layer 222.

Figure 1B:
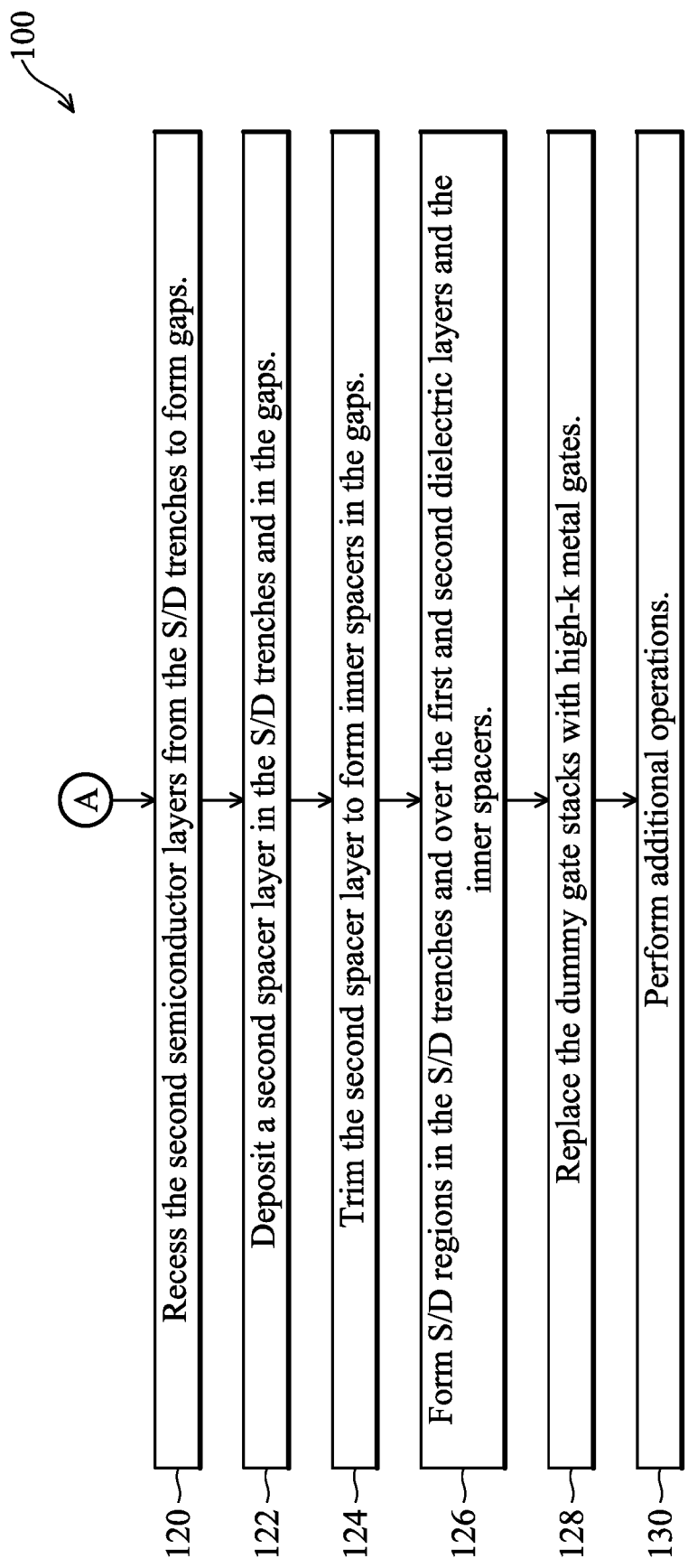
Figures 11A, 11B:
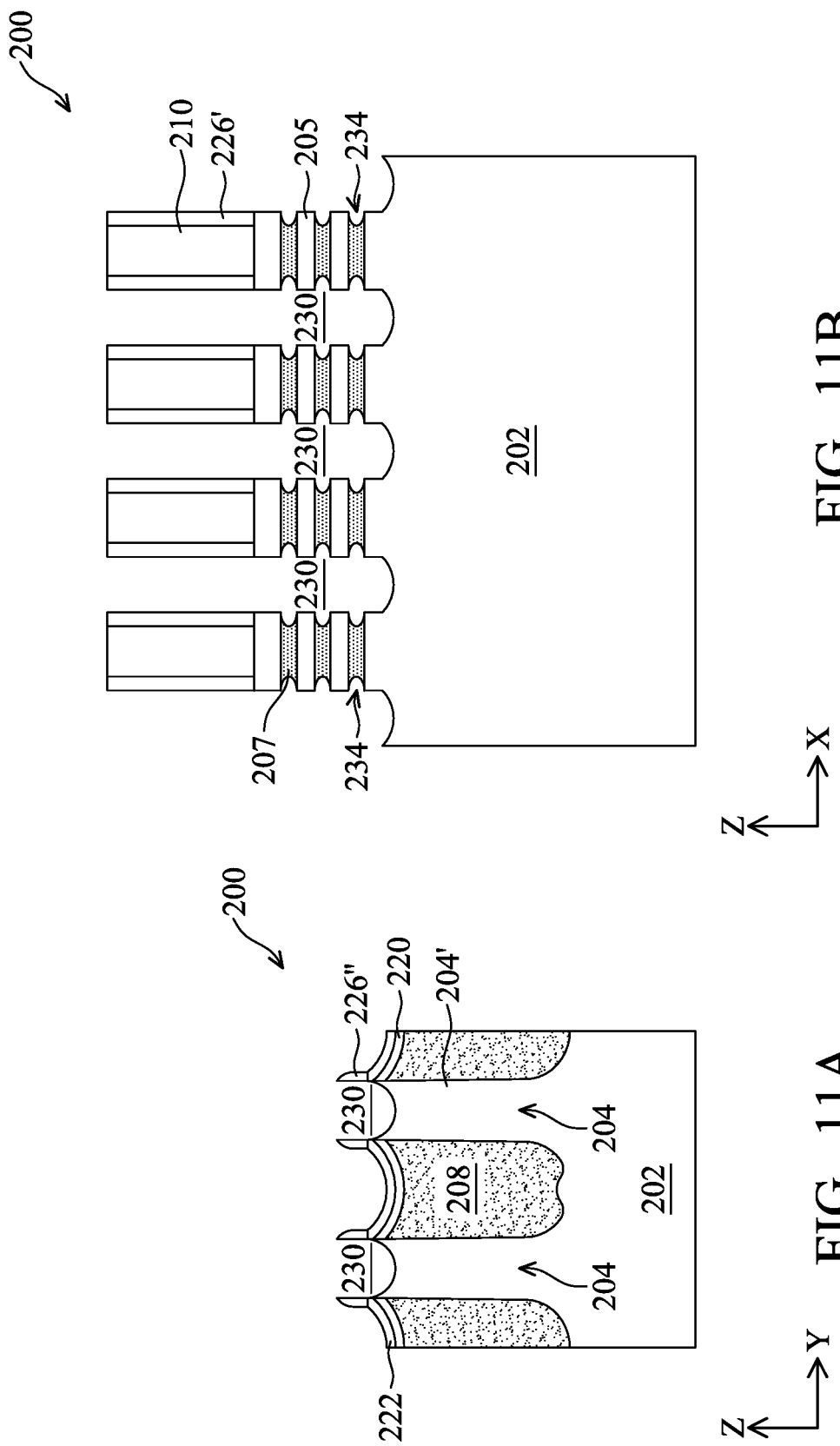

Referring to FIGS. 1B and 11A-11B, method 100 at operation 120 selectively removes portions of the non-channel layers 207 exposed in the S/D recesses 230 in an etching process to form gaps (or recesses) 234. As shown in FIG. 11B, the gaps 234 are vertically between adjacent channel layers 205. In an embodiment, the etching process is selectively tuned such that the non-channel layers 207 are etched at a significantly higher rate than the channel layers 205. Additionally, the etching process is also selectively tuned to etch the non-channel layers 207 with little to no etching to the base fins 204', the dielectric layer 222, the dummy gate stacks 210, the gate sidewall spacers 226', and the fin sidewall spacers 226". In some embodiments, the etching process is a wet etching process that implements $H_2O_2$, a hydroxide (e.g., $NH_4OH$, TMAH, etc.), $CH_3COOH$, other suitable etchants, or combinations thereof. In some embodiments, the etching process is a dry etching process that implements a fluorine-containing gaseous species provided herein.

Figure 12B:
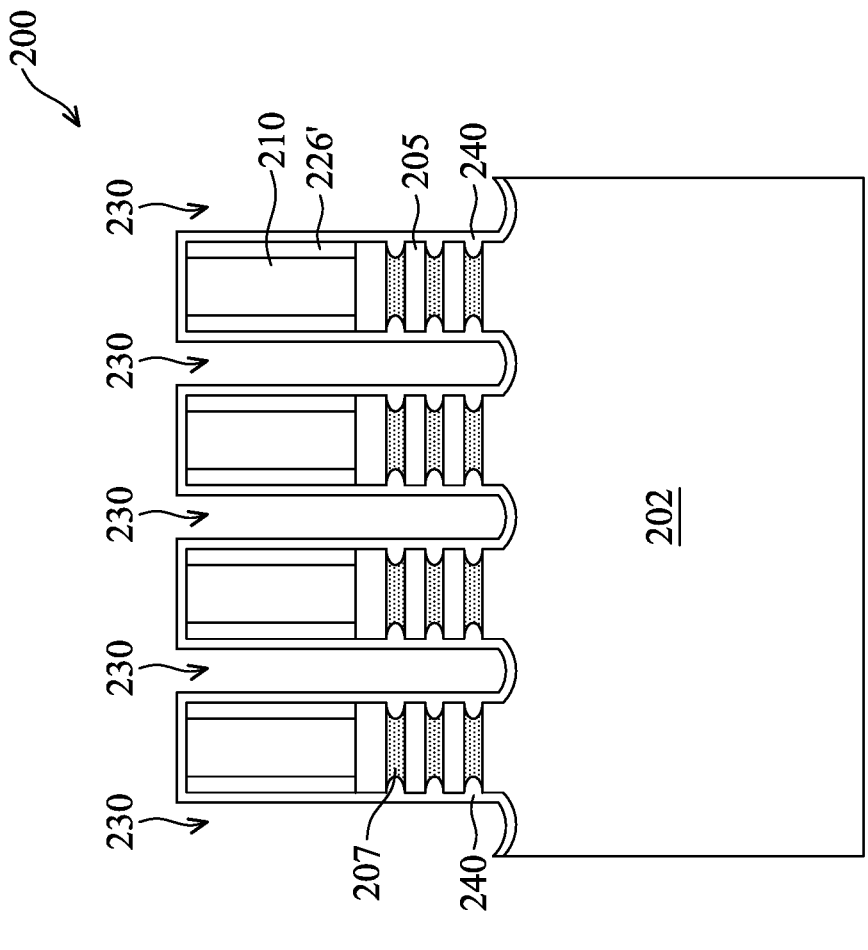
Figure 12A:
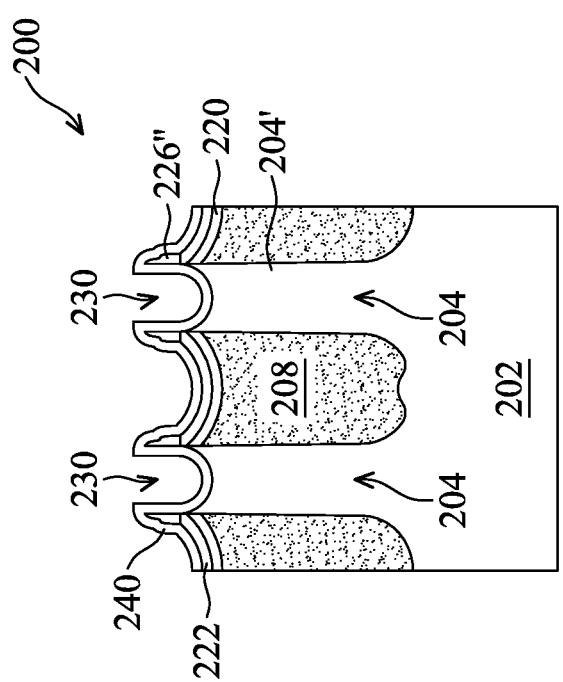

Referring to FIGS. 1B and 12A-12B, method 100 at operation 122 deposits a dielectric layer 240 in the S/D recesses 230. The dielectric layer 240 may be deposited using any suitable deposition process, such as ALD, CVD, other suitable methods, or combinations thereof. In the present embodiments, the dielectric layer 240 is conformally deposited over the device 200, such that it is formed on exposed surfaces of the fins 204, the gate sidewall spacers 226', the fin sidewall spacers 226", and the dielectric layer 222, and filling the gaps 234. the dielectric layer 240 may include any suitable dielectric material comprising silicon, carbon, oxygen, nitrogen, other elements, or combinations thereof. For example, the dielectric layer 240 may include silicon nitride, silicon carbide, silicon oxide, carbon-containing silicon nitride (SiCN), carbon-containing silicon oxide (SiOC), oxygen-containing silicon nitride (SiON), carbon-and-oxygen-doped silicon nitride (SiOCN), a low-k dielectric material, tetraethylorthosilicate (TEOS) formed oxide, doped silicon oxide (e.g., borophosphosilicate glass (BPSG), fluorine-doped silicon oxide (FSG), phosphosilicate glass (PSG), boron-doped silicate glass (BSG), etc.), air, other suitable dielectric material, or combination thereof. The dielectric layer 240 may be configured as a single-layer structure or a multi-layer structure including a combination of the dielectric materials provided herein. In some embodiments, the dielectric layer 240 have a different composition from that of the gate sidewall spacers 226' and the fin sidewall spacers 226". In some embodiments, the dielectric layer 240 have the same composition as that of the gate sidewall spacers 226' and the fin sidewall spacers 226". Furthermore, in the present embodiment, the dielectric layer 240 and the dielectric layer 222 have different compositions.

Figures 13A, 13B:
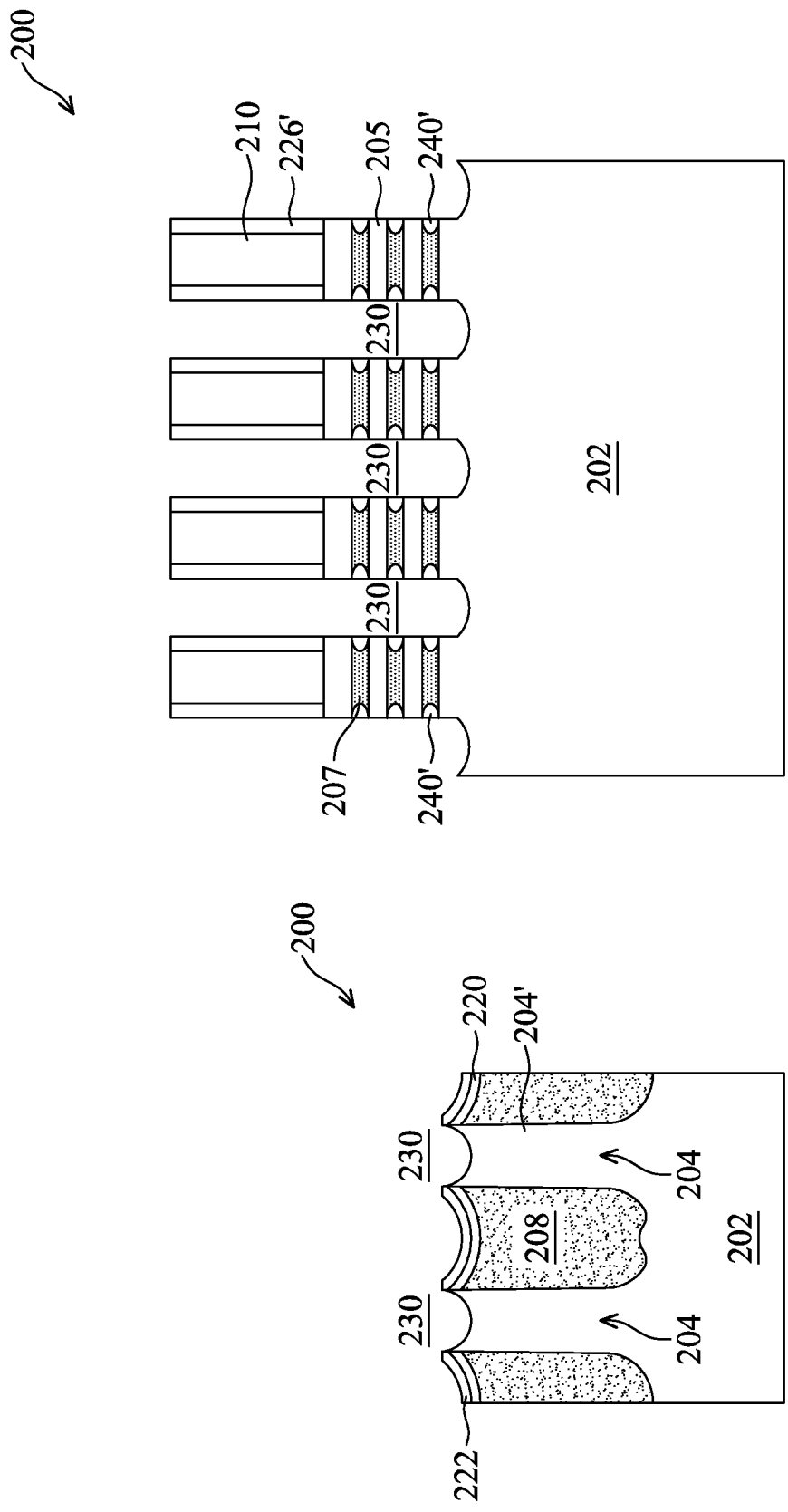

Referring to FIGS. 1B and 13A-13B, method 100 at operation 124 performs one or more etching processes (also referred to as trimming processes) to remove portions of the dielectric layer 240 from the dummy gate stacks 210, the gate sidewall spacers 226', the fin sidewall spacers 226", and sidewalls of the S/D recesses 230. Portions of the dielectric layer 240 remaining in the gaps 234 are referred to as the inner spacers 240'. After the trimming processes, method 100 may perform one or more cleaning processes to the device 200 to remove any etching residues in the S/D recesses 230. As depicted in FIG. 13A, the fin sidewall spacers 226" (which are relatively short prior to this operation) are removed or substantially removed by the trimming and cleaning processes in this embodiment. The dielectric layers 222 and 220 protect the isolation structure 208 from the various trimming and cleaning processes.

Referring to FIGS. 1B and 14A-14B, method 100 at operation 126 epitaxially grows S/D features 250 in the S/D recesses 230. FIG. 14A depicts an embodiment of the device 200 that includes the dielectric layers 222 and 220 disposed above the isolation structure 208 and on sidewalls of the epitaxial S/D features 250. As discussed above, the dielectric layers 222 and 220 protect the isolation structure 208 from various trimming and cleaning processes. Without the dielectric layers 222 and 220, portions of the isolation structure 208 might be removed and sidewalls of the base fins 204' might be exposed. In certain implementations, such loss of the isolation structure 208 might lead to undesired lateral growth (e.g., along the Y axis) of the S/D features 250, which in turn would lead to excessive junction leakage. By having the dielectric layers 222 and 220, undesired lateral growth of the S/D features 250 is avoided. The epitaxial S/D features 250 may be configured as an n-type epitaxial S/D feature or a p-type epitaxial S/D feature for forming an NFET or a PFET, depending on specific design requirement. The epitaxial S/D features 250 may include one or more epitaxial layers of silicon (epi Si) or silicon carbon (epi SiC) doped with an n-type dopant such as arsenic, phosphorus, other n-type dopants, or combinations thereof to form an n-type epitaxial S/D feature. Alternatively, the epitaxial S/D features 250 may include one or more epitaxial layers of silicon germanium (epi SiGe) doped with a p-type dopant such as boron, germanium, indium, other p-type dopants, or combinations thereof to form a p-type epitaxial S/D feature. Method 100 may form the epitaxial S/D features 250 by implementing an epitaxy growth process as discussed above with respect to forming various layers of the ML. In some embodiments, the epitaxial material is doped in-situ by adding a dopant to a source material during the epitaxy growth process. In some embodiments, the epitaxial material is doped by an ion implantation process after performing a deposition process. In some embodiments, an annealing process is subsequently performed to activate the dopants in the epitaxial S/D features 250. As shown in FIG. 14A, the dielectric layers 220 and 222 extend from one of the S/D features 250 to another one of the S/D features 250 and directly on a top surface of the isolation structure 208.

Figures 15A, 15B:
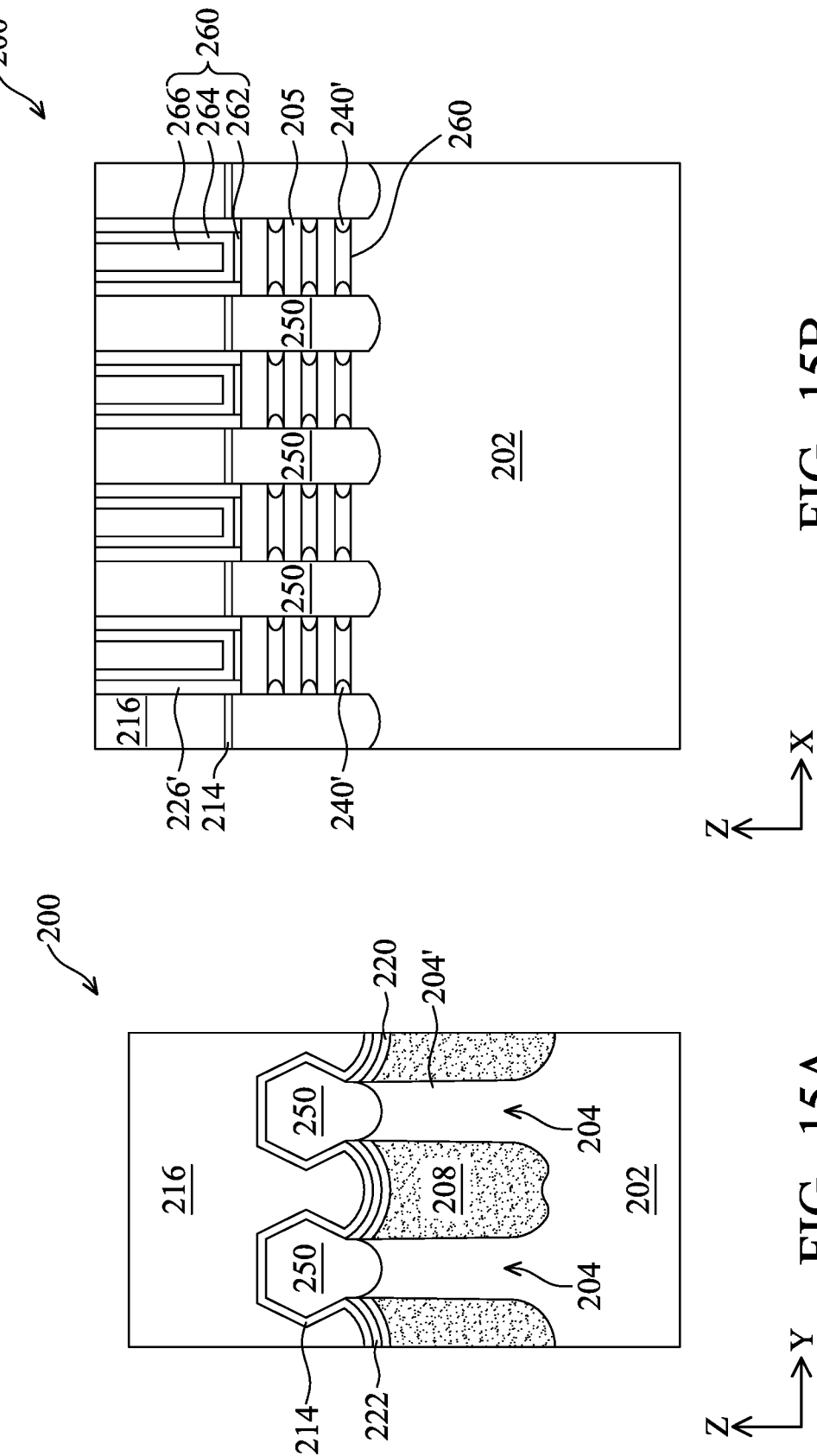

Referring to FIGS. 1B and 15A-15B, method 100 at operation 128 replaces the dummy gate stacks 210 with high-k metal gates 260. This includes multiple deposition and etching steps. For example, method 100 forms an interlayer dielectric (ILD) layer 216 over the epitaxial S/D features 250, the dielectric layer 222, and the dummy gate stacks 210. The ILD layer 216 may include silicon oxide, a low-k dielectric material, TEOS formed oxide, doped silicon oxide (e.g., BPSG, FSG, PSG, BSG, etc.), other suitable dielectric materials, or combinations thereof. In some embodiments, method 100 may form an etch-stop layer (ESL) 214 over the epitaxial S/D features 250 before forming the ILD layer 216. The ESL 214 may include silicon nitride, silicon carbide, carbon-containing silicon nitride (SiCN), oxygen-containing silicon nitride (SiON), carbon-and-oxygen-doped silicon nitride (SiOCN), aluminum nitride, a high-k dielectric material, other suitable materials, or combinations thereof. The ILD layer 216 and the ESL 214 may each be formed by CVD, FCVD, ALD, PVD, other suitable methods, or combinations thereof. As shown in FIG. 15A, the dielectric layer 222 is under the ESL 214 in this embodiment. Further, the dielectric layer 222 is below the top surface of the S/D features 250. Still further, the ESL 214 is directly on surfaces of the S/D features not covered by the dielectric layers 222 and 220 and the isolation structure 208. The dielectric layers 222 and 220 are between the ESL 214 and the isolation structure 208. After planarizing the ESL and the ILD layer 216 in one or more CMP processes, at least portions of the dummy gate stack 210 are removed from the device 200 to form a gate trench (not depicted) by any suitable etching process, such as a dry etching process. In some embodiments, the dummy oxide layer 209 is removed from the gate trench and replaced with an interfacial layer (not depicted) before forming the metal gate structure in the gate trench.

Subsequently, method 100 at operation 128 performs the sheet release process to form openings (not depicted) between the channel layers 205 in the fins 204. The sheet release process may be implemented by an etching process that does not, or does not substantially, remove the channel layers 205 and other surrounding dielectric features of the device 200. The etching process may be a dry etching process or a wet etching process selective to the material included in the non-channel layers 207. The resulting openings provide space for forming the high-k metal gates between the channel layers 205.

Thereafter, method 100 at operation 128 forms high-k metal gates 260 in the gate trenches and the openings. As a result, portions of the high-k metal gates 260 wrap around and engage with each channel layer 205. In the present embodiments, the high-k metal gates 260 include a high-k dielectric layer 262 disposed over and surrounding the channel layers 205, a work function metal (WFM) layer 264 disposed over the high-k dielectric layer 262, and a metal fill layer (or bulk metal layer) 266 over the WFM layer 264. In the present embodiments, the high-k dielectric layer 262 includes any suitable high-k dielectric material, such as hafnium oxide, lanthanum oxide, other suitable materials, or combinations thereof. In the present embodiments, the WFM layer 264 includes an n-type work function layer for NMOSFET device or a p-type work function layer for PMOSFET device. An n-type work function layer may comprise a metal with sufficiently low effective work function such as titanium, aluminum, tantalum carbide, tantalum carbide nitride, tantalum silicon nitride, or combinations thereof. A p-type work function layer may comprise a metal with a sufficiently large effective work function, such as titanium nitride, tantalum nitride, ruthenium, molybdenum, tungsten, platinum, or combinations thereof. The metal fill layer 266 may include Cu, W, Al, Co, Ru, other suitable materials, or combinations thereof. The high-k metal gates 260 may each further include other layers (not depicted), such as a capping layer, a barrier layer, other suitable layers, or combinations thereof. Various layers of the high-k metal gates 260 may be formed by any suitable method, such as chemical oxidation, thermal oxidation, ALD, CVD, PVD, plating, other suitable methods, or combinations thereof.

Thereafter, method 100 at operation 130 may perform additional processing steps to the device 200. For example, method 100 may form S/D contacts (not depicted) over the epitaxial S/D features 250. Each S/D contact may include any suitable conductive material, such as Co, W, Ru, Cu, Al, Ti, Ni, Au, Pt, Pd, other suitable conductive materials, or combinations thereof. Further, method 100 may form additional features over the device 200, such as gate contacts over the high-k metal gates 260, vertical interconnect features (e.g., vias), horizontal interconnect features (e.g., conductive lines), additional intermetal dielectric layers (e.g., ESLs and ILD layers), other suitable features, or combinations thereof.

Figure 16A:
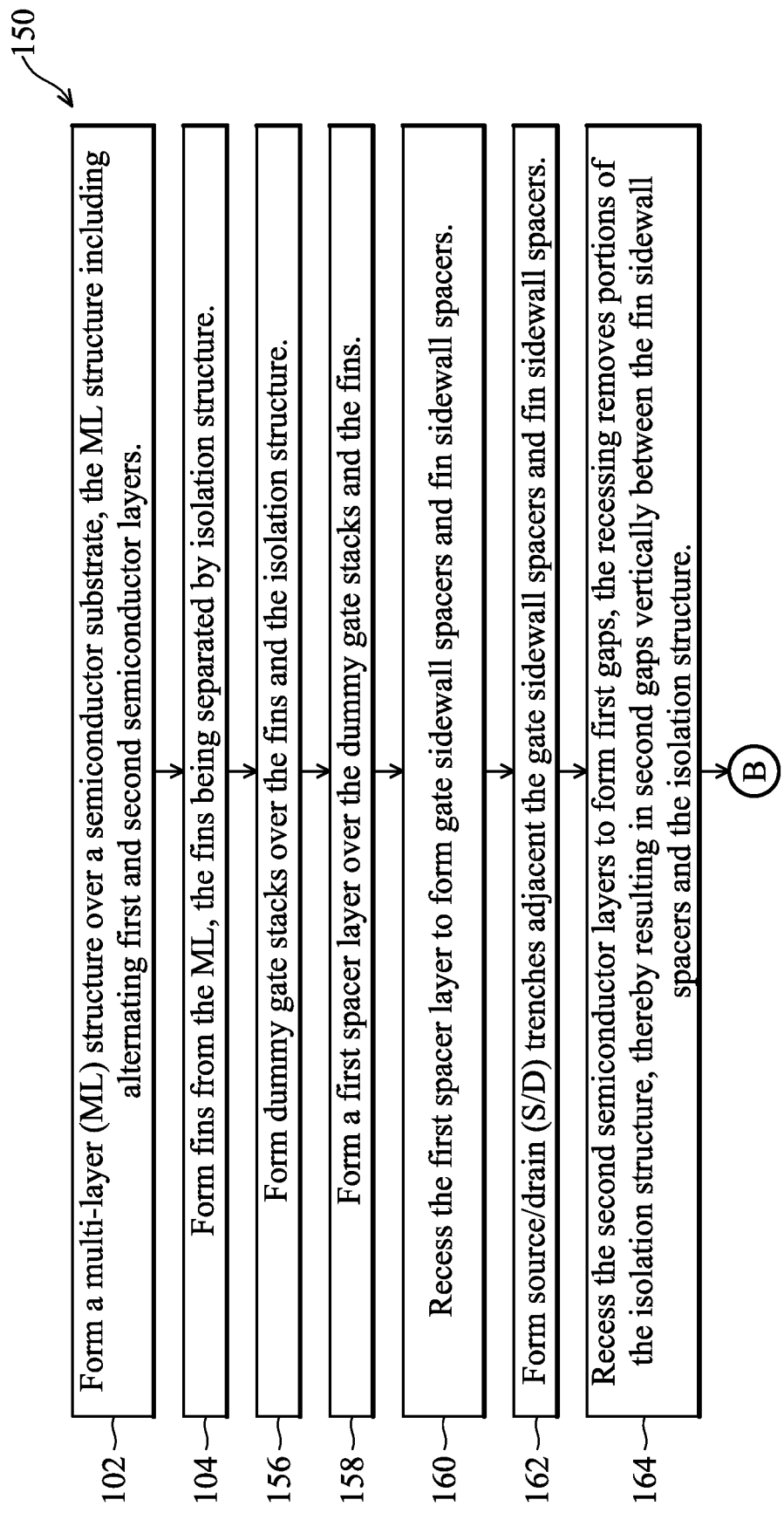
FIGS. 16A and 16B illustrate a flowchart of another example method for fabricating a semiconductor device according to various embodiments of the present disclosure.
Figure 16B:
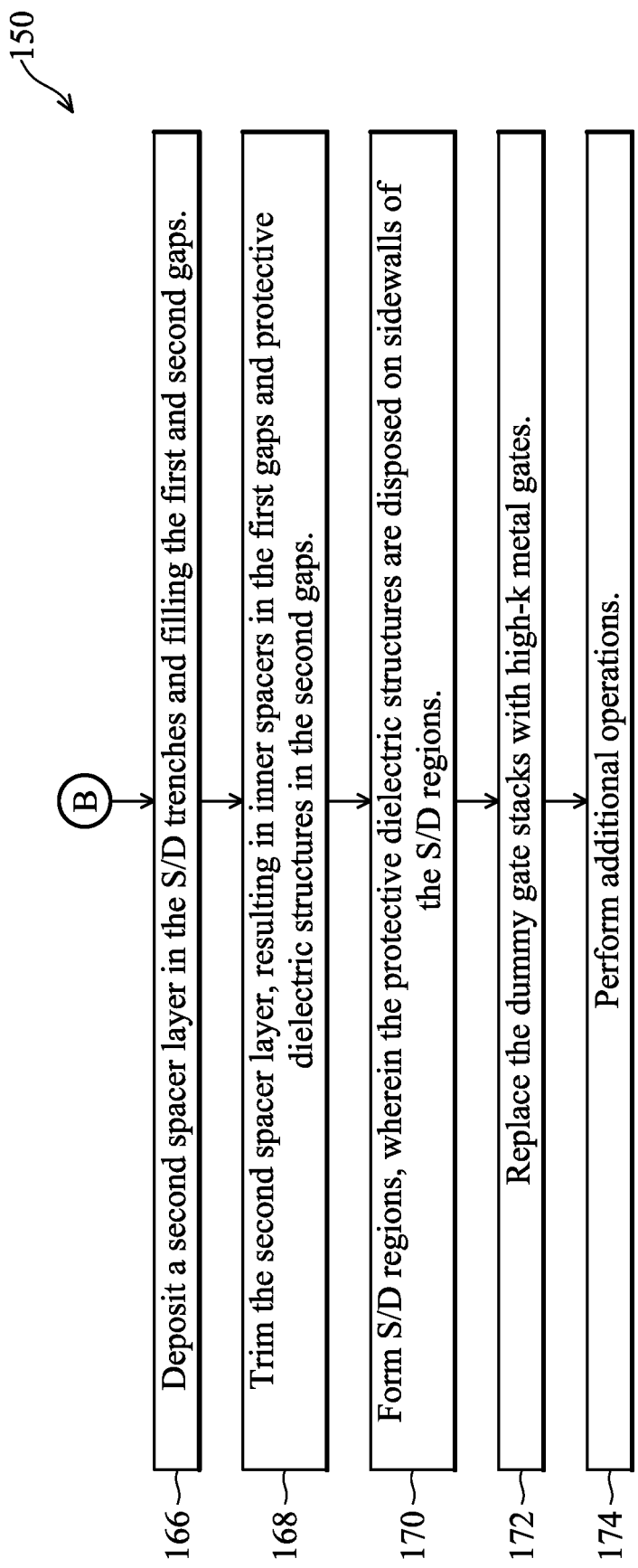

Referring now to FIGS. 16A-16B, flowchart of method 150 of forming a semiconductor device (hereafter referred to as the device) 200 is illustrated according to various aspects of the present disclosure. The method 150 includes operations 102 and 104, which have been discussed with reference to FIGS. 1A-1B.

Figure 17A:
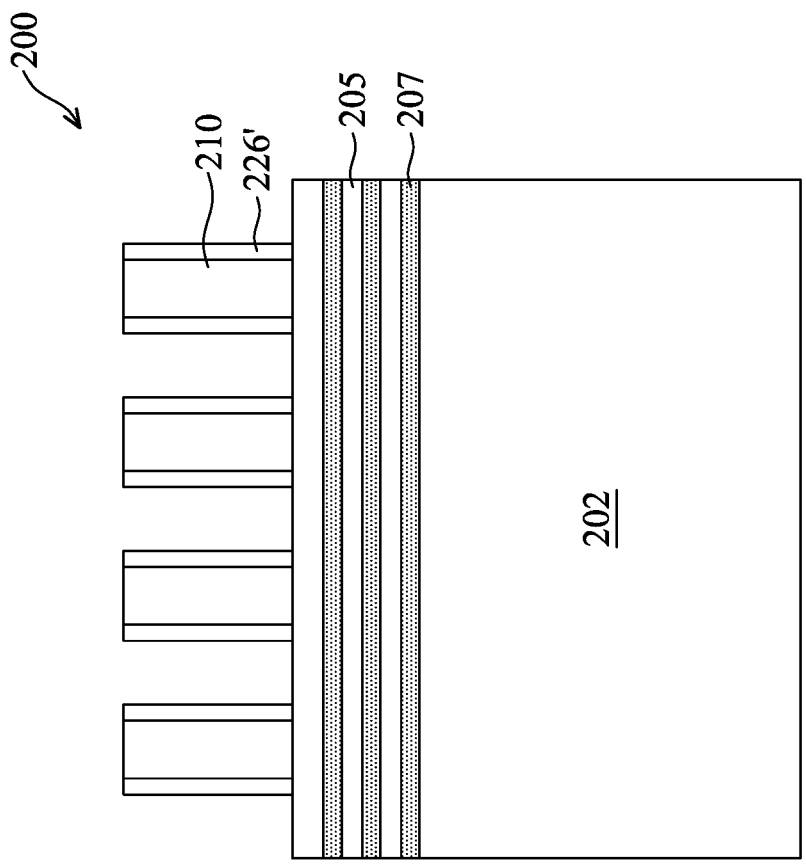
Figure 17B:
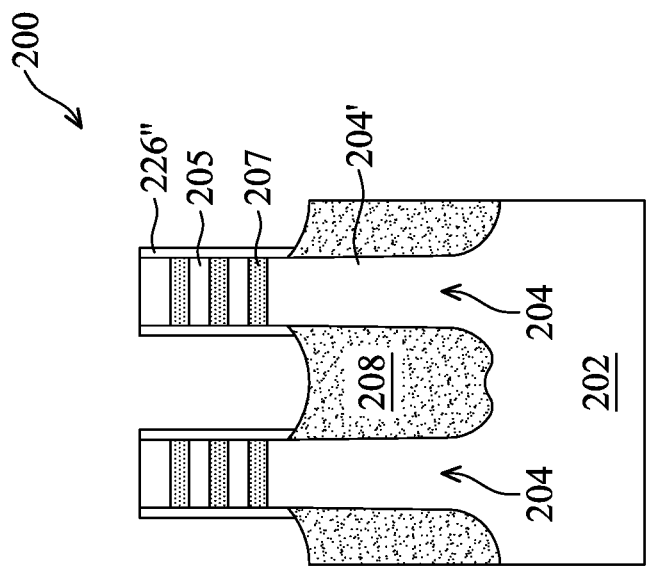

Referring to FIGS. 16A and 17A-17B, method 150 at operation 156 forms dummy gate stacks 210 over the fins 204 and the isolation structure 208. This is similar to the operation 112 discussed above with some differences. In operation 112, the dummy gate stacks 210 are formed over or directly on the dielectric layer 222 which is over the isolation structure 208. In operation 156, the dummy gate stacks 210 are formed over or directly on the isolation structure 208, and there is no dielectric layer 222 on the isolation structure 208.

Still referring to FIGS. 16A and 17A-17B, method 150 at operation 158 deposits one or more dielectric layers (or spacer layers) 226 over the fins 204 (specifically the channel layers 205 and the non-channel layers 207), and the dummy gate stacks 210. This is same as or similar to the operation 114 discussed above with reference to FIGS. 8A-8B. Particularly, the one or more dielectric layers 226 are deposited over the top and sidewall surfaces of the fins 204 and over the top and sidewall surfaces of the dummy gate stacks 210. The one or more dielectric layers 226 may include silicon oxide, silicon nitride, silicon oxynitride (SiON), silicon carbide, silicon carbon nitride (SiCN), silicon oxycarbide (SiOC), silicon oxycarbon nitride (SiOCN), carbon doped oxide, nitrogen doped oxide, porous oxide, or a combination thereof. The one or more dielectric layers 226 may be deposited using CVD or other suitable methods. In an embodiment, the one or more dielectric layers 226 include a layer of silicon nitride.

Still referring to FIGS. 16A and 17A-17B, method 150 at operation 160 etches the one or more dielectric layers 226 using one or more anisotropic etching processes. This is same as or similar to operation 116 with reference to FIGS. 9A-9B. As a result, the portions of the one or more dielectric layers 226 on the top surfaces of the fins 204, the top surface of the isolation structure 208, and the top surfaces of the dummy gate stacks 210 are removed. Portions of the one or more dielectric layers 226 remain on the sidewall surfaces of the dummy gate stacks 210, which are referred to as gate sidewall spacers 226'. Portions of the one or more dielectric layers 226 remain on the sidewall surfaces of the fins 204, which are referred to as fin sidewall spacers 226".

Figure 18B:
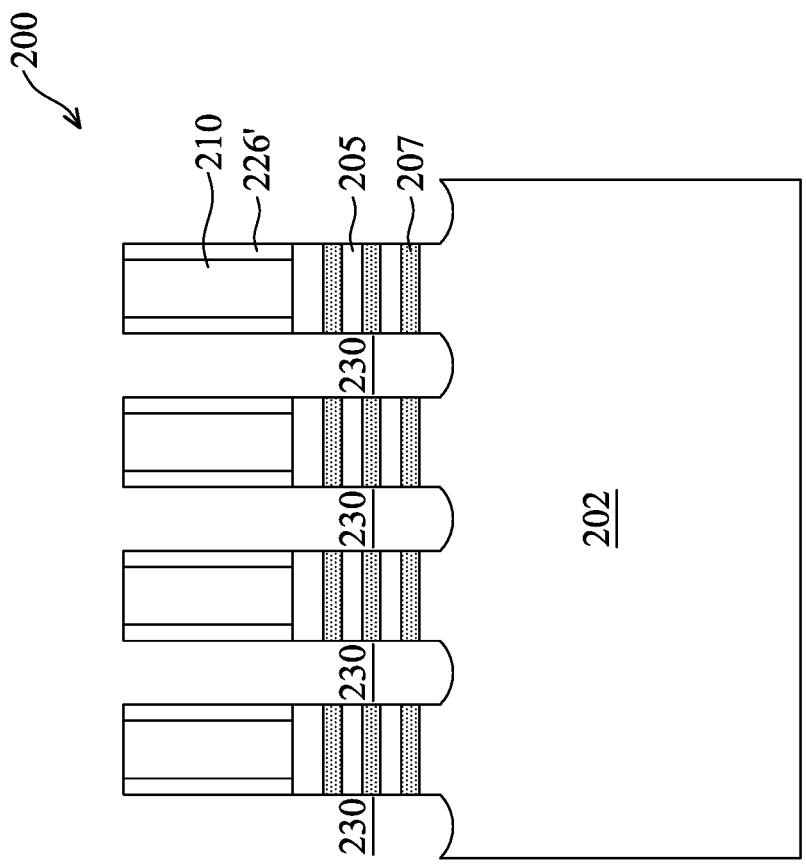
Figure 18A:
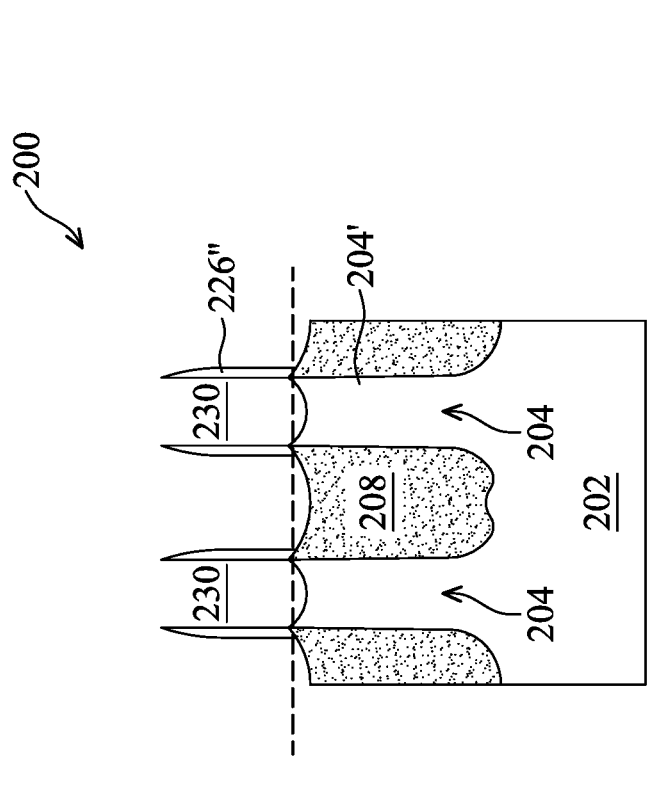

Referring to FIGS. 16A and 18A-18B, method 150 at operation 162 forms S/D recesses (or S/D trenches) 230 in the S/D regions of the fins 204 adjacent the gate sidewall spacers 226' and fin sidewall spacers 226". This is same as or similar to operation 118 discussed above.

Figure 19B:
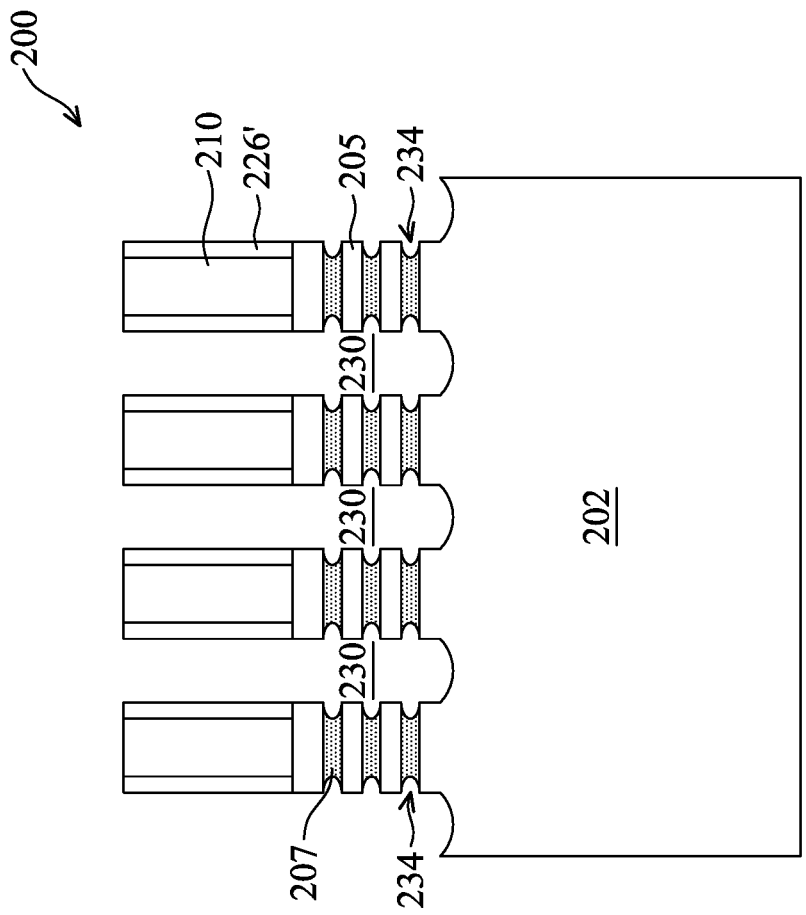
Figure 19A:
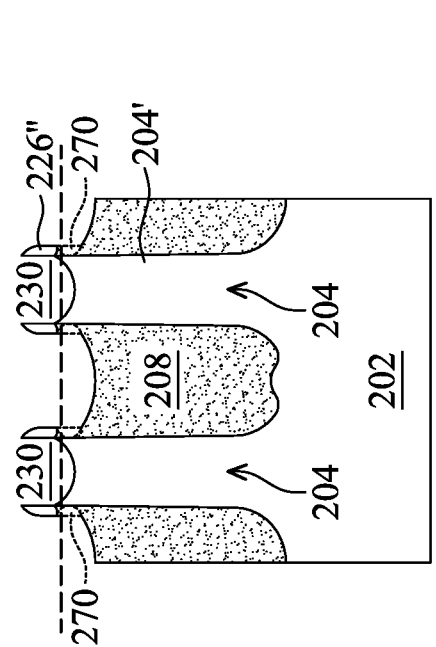

Referring to FIGS. 16A and 19A-19B, method 150 at operation 164 selectively removes portions of the non-channel layers 207 exposed in the S/D recesses 230 in an etching process to form gaps (or recesses) 234. This is similar to the operation 120 discussed above. Different from the operation 120, since there are no dielectric layers 222 and 220 over the isolation structure 208, the various etching and cleaning processes performed to remove the portions of the non-channel layers 207 also laterally etch the isolation structure 208, thereby forming gaps (or recesses) 270 vertically between the fin sidewall spacers 226" and the isolation structure 208, such as shown in FIG. 19A. In some embodiments, the gaps 270 expose the sidewalls of the base fin 204'.

Figure 20B:
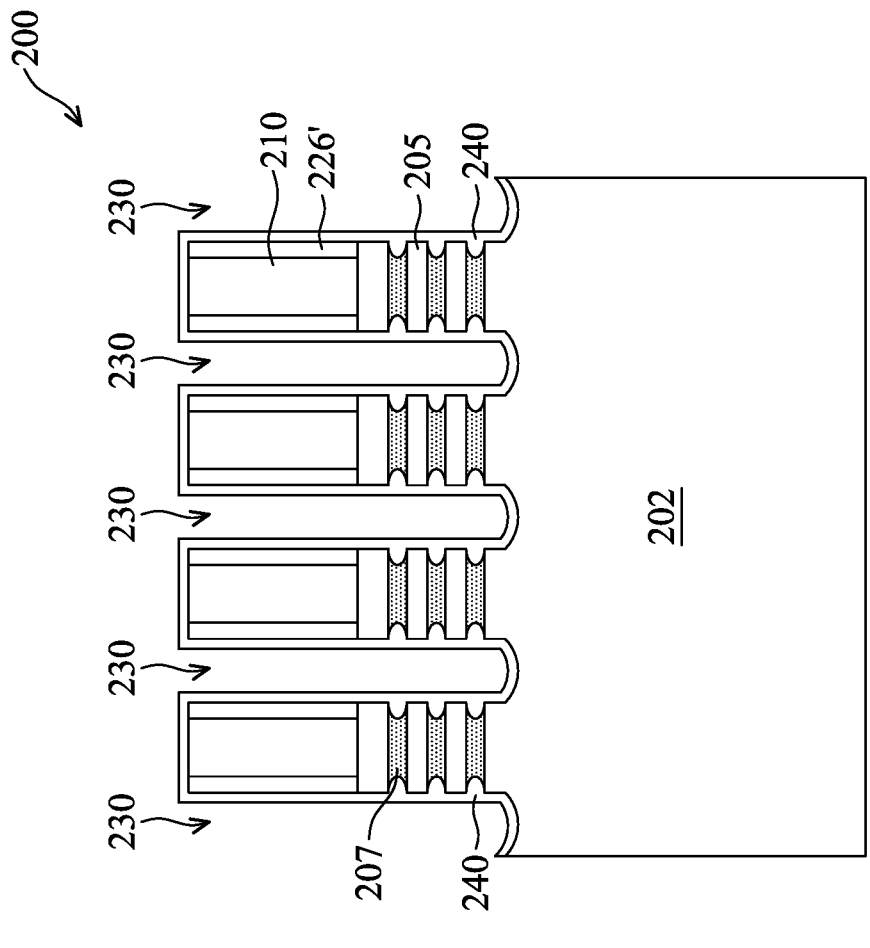
Figure 20A:
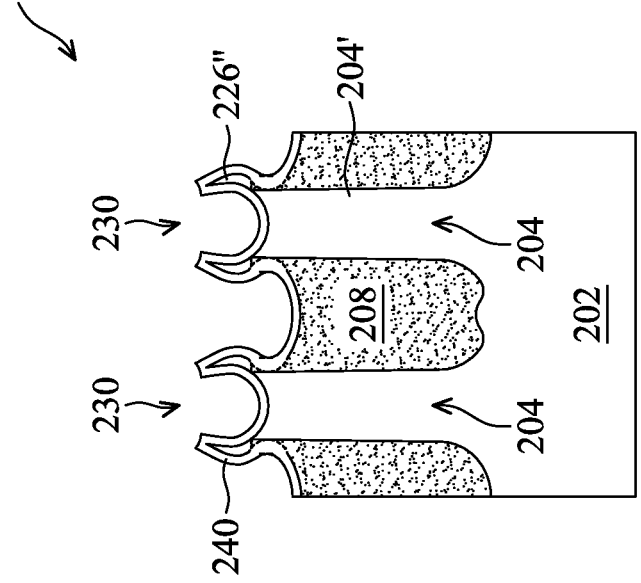

Referring to FIGS. 16B and 20A-20B, method 150 at operation 166 deposits a dielectric layer 240 in the S/D recesses 230. For example, the dielectric layer 240 may be conformally deposited over the device 200, such that it is formed on exposed surfaces of the fins 204, the gate sidewall spacers 226', the fin sidewall spacers 226", and the isolation structure 208. This is similar to operation 122 discussed above. One difference is that the dielectric layer 240 fills not only the gaps 234, but also the gaps 270 at the operation 166. In an embodiment, the dielectric layer 240 includes silicon nitride and has a thickness in a range from about 5 nm to about 10 nm.

Referring to FIGS. 16B and 21A-21B, method 150 at operation 168 performs one or more etching processes (also referred to as trimming processes) to remove portions of the dielectric layer 240 from the dummy gate stacks 210, the gate sidewall spacers 226', the fin sidewall spacers 226", and sidewalls of the S/D recesses 230. This is same as or similar to operation 124 discussed above. Portions of the dielectric layer 240 remaining in the gaps 234 are referred to as the inner spacers 240'. Portions of the dielectric layer 240 remaining in the gaps 270 are referred to as the protective dielectric structures 240". In an embodiment, the inner spacers 240' and the protective dielectric structures 240" each includes silicon nitride. The thickness of each protective dielectric structures 240" may be in a range from about 5 nm to about 10 nm in some embodiments. In an embodiment, the trimming process(es) includes applying a power in a range from about 500 W to about 700 W and a pressure in a range from about 10 torr to about 25 torr. Such etching condition results in the structures 240' and 240" in the respective gaps, while the other portions of the dielectric layer 240 are removed. After the trimming processes, method 100 may perform one or more cleaning processes to the device 200 to remove any etching residues in the S/D recesses 230. As depicted in FIG. 21A, the fin sidewall spacers 226" (which are relatively short prior to this operation) are removed or substantially removed by the trimming and cleaning processes.

Figure 22B:
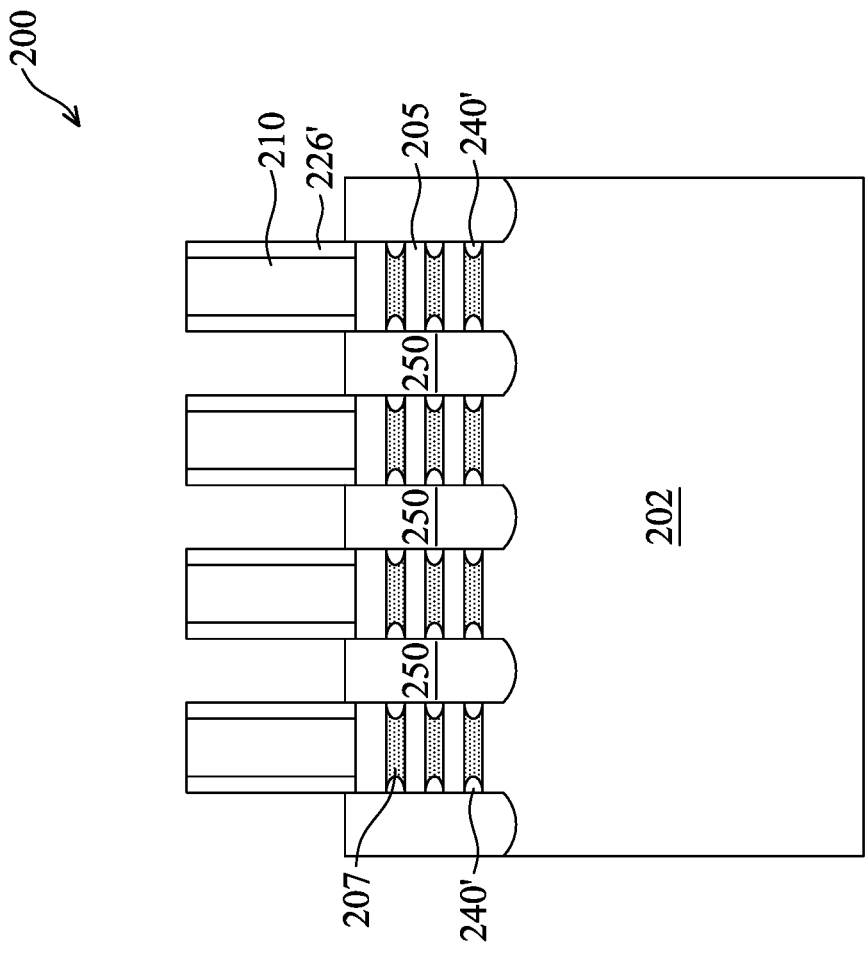
Figure 22A:

Referring to FIGS. 16B and 22A-22B, method 150 at operation 170 epitaxially grows S/D features 250 in the S/D recesses 230. This is same as or similar to operation 126 discussed above. FIG. 22A depicts an embodiment of the device 200 that includes the protective dielectric structures 240" disposed above the isolation structure 208 and on sidewalls of the epitaxial S/D features 250. Without the protective dielectric structures 240", the S/D features 250 may grow laterally (e.g., along the Y axis) at the locations indicated with 240", which in turn would lead to excessive junction leakage. As shown in FIG. 22A, a top surface of the isolation structure 208 extends between two adjacent ones of the S/D features 250, and the protective dielectric structures 240" are free from a central region of the top surface of the isolation structure 208. The epitaxial S/D features 250 may be configured as an n-type epitaxial S/D feature or a p-type epitaxial S/D feature for forming an NFET or a PFET, depending on specific design requirement.

Figure 23B:
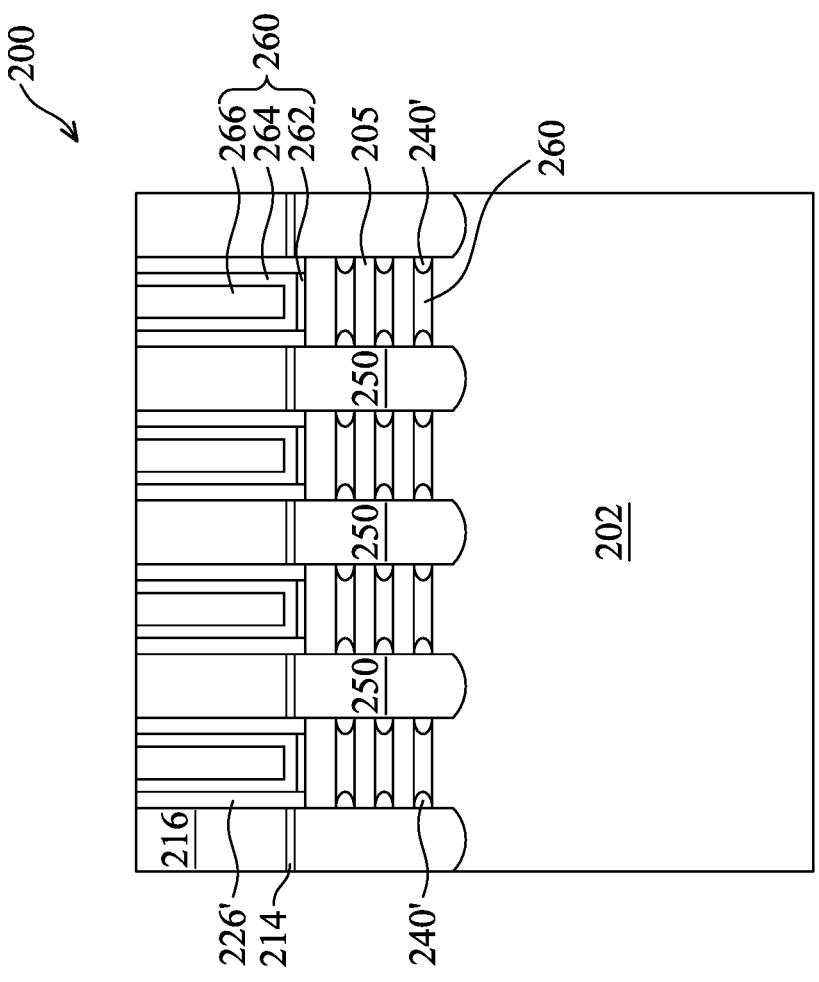
Figure 23A:
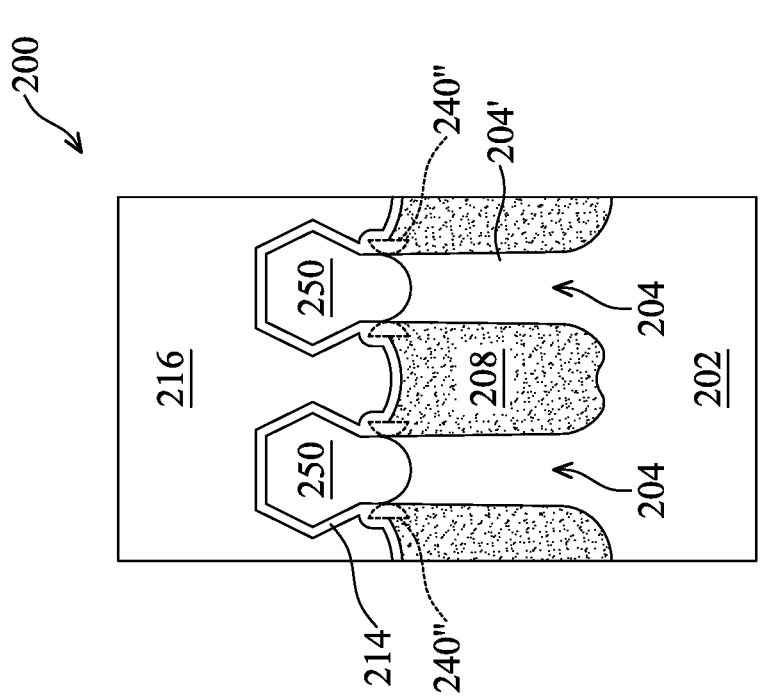

Referring to FIGS. 16B and 23A-23B, method 150 at operation 172 replaces the dummy gate stacks 210 with high-k metal gates 260. This is same as or similar to operation 128 discussed above. As shown in FIG. 23A, the protective dielectric structures 240" are under the ESL 214 in this embodiment and laterally (along the Y axis) between the S/D features 250 and the ESL 214 and isolation structure 208. Further, the protective dielectric structures 240" are below the top surface of the S/D features 250. Still further, the ESL 214 is directly on surfaces of the S/D features and the isolation structure 208 that are not covered by the protective dielectric structures 240". Thereafter, method 150 at operation 174 may perform additional processing steps to the device 200, which is same as or similar to operation 130 discussed above.

Although not intended to be limiting, one or more embodiments of the present disclosure provide many benefits to a semiconductor device and the formation thereof. For example, the present disclosure provides methods of forming a GAA FET including dielectric layers or structures over an isolation structure and on sidewalls of base fins. The dielectric layers or structures prevent undesired lateral growth of source/drain features, thereby reducing junction leakage. Embodiments of the present disclosure can be readily integrated into existing semiconductor manufacturing processes.

In an example aspect, the present disclosure is directed to a method that includes providing a structure having a substrate, fin structures over the substrate, and an isolation structure over the substrate and laterally between adjacent fin structures, wherein each fin structure includes first and second semiconductor layers alternatingly stacked, the first semiconductor layers includes a first semiconductor material, the second semiconductor layers includes a second semiconductor material that is different from the first semiconductor material. The method further includes depositing a first dielectric layer over top and sidewalls of the fin structures and over a top surface of the isolation structure; depositing a second dielectric layer over the first dielectric layer; and etching back the first and the second dielectric layers such that the first and the second dielectric layers remain on the top surface of the isolation structure and are removed from the top and sidewalls of the fin structures. The method further includes forming dummy gate stacks over the fin structures; forming gate spacers on sidewalls of the dummy gate stacks; and recessing the fin structures adjacent the gate spacers, resulting in source and drain trenches that laterally expose the first and second semiconductor layers. The method further includes laterally recessing the second semiconductor layers from the source and drain trenches, resulting in gaps vertically between adjacent ones of the first semiconductor layers; and forming inner spacers in the gaps, wherein the first and the second dielectric layers remain on the top surface of the isolation structure.

In an embodiment, the method further includes epitaxially growing source and drain regions from the source and drain trenches, while the first and the second dielectric layers remain on the top surface of the isolation structure. In a further embodiment, the method includes depositing one or more dielectric layers over the source and drain regions and over the first and the second dielectric layers. In a further embodiment, the method includes replacing the dummy gate stacks with high-k metal gates.

In an embodiment of the method, the first dielectric layer includes carbon-doped silicon oxide. In an embodiment, the second dielectric layer includes silicon nitride. In a further embodiment, the etching back of the first and the second dielectric layers includes an etching process that applies a power in a range of about 100 W to 250 W and a pressure in a range of about 40 torr to about 60 torr. In another further embodiment, the first dielectric layer is formed by doping carbon into the isolation structure. In some embodiments of the method, the first dielectric layer, the second dielectric layer, the gate spacers, and the inner spacers include different dielectric materials, for example, to achieve etch selectivity.

In another example aspect, the present disclosure is directed to a method that includes providing a structure having a substrate, fin structures over the substrate, an isolation structure over the substrate and laterally between adjacent fin structures, dummy gate stacks over the isolation structure and engaging the fin structures, wherein each fin structure includes first and second semiconductor layers alternatingly stacked, the first semiconductor layers includes a first semiconductor material, the second semiconductor layers includes a second semiconductor material that is different from the first semiconductor material. The method further includes forming gate spacers on sidewalls of the dummy gate stacks and fin sidewall spacers on sidewalls of the fin structures; and recessing the fin structures adjacent the gate spacers and the fin sidewall spacers, resulting in source and drain trenches that laterally expose the first and second semiconductor layers. The method further includes laterally recessing the second semiconductor layers from the source and drain trenches, resulting in first gaps vertically between adjacent ones of the first semiconductor layers and second gaps vertically between the fin sidewall spacers and the isolation structure. The method further includes forming first dielectric structures in the first and second gaps and epitaxially growing source and drain regions from the source and drain trenches while the first dielectric structures remain in the first and second gaps.

In an embodiment of the method, the first dielectric structures include silicon nitride. In a further embodiment, the forming of the first dielectric structures includes depositing a first dielectric layer in the source and drain trenches and filling the first and second gaps and performing a trimming process to the first dielectric layer such that portions of the first dielectric layer remain in the first and second gaps and become the first dielectric structures, and other portions of the first dielectric layer are removed. In a further embodiment, the trimming process includes applying a power in a range from about 500 W to about 700 W and a pressure in a range from about 10 torr to about 25 torr. In a further embodiment, the first dielectric layer is deposited to a thickness about 5 nm to about 10 nm.

In an embodiment, the method further includes depositing one or more dielectric layers over the source and drain regions and over the first dielectric structures. In another embodiment, the method further includes replacing the dummy gate stacks with high-k metal gates.

In yet another example aspect, the present disclosure is directed to a semiconductor structure that includes a substrate, fin structures over the substrate, an isolation structure over the substrate and laterally between adjacent fin structures, source and drain regions over the fin structures and the isolation structure, semiconductor channel layers over the fin structures and the isolation structure and connecting the source and drain regions, a gate structure wrapping around each of the semiconductor channel layers, dielectric structures on sidewalls of the source and drain regions, over the isolation structure, and below a top surface of the source and drain regions, and an etch stop layer on the dielectric structures and on surfaces of the source and drain regions.

In an embodiment of the semiconductor structure, one of the dielectric structures extends from one of the source and drain regions to another one of the source and drain regions and directly on a top surface of the isolation structure. In a further embodiment, the one of the dielectric structures includes a first dielectric layer having carbon-doped silicon oxide and a second dielectric layer over the first dielectric layer and having silicon nitride.

In another embodiment of the semiconductor structure, a top surface of the isolation structure extends between two adjacent ones of the source and drain regions, and the dielectric structures are free from a central region of the top surface of the isolation structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a substrate, fin structures over the substrate, an isolation structure over the substrate and laterally between adjacent fin structures, dummy gate stacks over the isolation structure and engaging the fin structures, wherein each fin structure includes first and second semiconductor layers alternatingly stacked, the first semiconductor layers includes a first semiconductor material, the second semiconductor layers includes a second semiconductor material that is different from the first semiconductor material;
forming gate spacers on sidewalls of the dummy gate stacks and fin sidewall spacers on sidewalls of the fin structures;
recessing the fin structures adjacent the gate spacers and the fin sidewall spacers, resulting in source and drain trenches that laterally expose the first and second semiconductor layers;

laterally recessing the second semiconductor layers from the source and drain trenches, resulting in first gaps vertically between adjacent ones of the first semiconductor layers and second gaps vertically between the fin sidewall spacers and the isolation structure;

forming first dielectric structures in the first and second gaps; and epitaxially growing source and drain regions from the source and drain trenches while the first dielectric structures remain in the first and second gaps.

2. The method of claim 1, wherein the first dielectric structures include silicon nitride.

3. The method of claim 2, wherein the forming of the first dielectric structures includes:

depositing a first dielectric layer in the source and drain trenches and filling the first and second gaps; and performing a trimming process to the first dielectric layer such that portions of the first dielectric layer remain in the first and second gaps and become the first dielectric structures, and other portions of the first dielectric layer are removed.

4. The method of claim 3, wherein the trimming process includes applying a power in a range from about 500 W to about 700 W and a pressure in a range from about 10 torr to about 25 torr.

5. The method of claim 3, wherein the first dielectric layer is deposited to a thickness about 5 nm to about 10 nm.

6. The method of claim 1, further comprising:

depositing one or more dielectric layers over the source and drain regions and over the first dielectric structures.

7. The method of claim 6, further comprising:

replacing the dummy gate stacks with high-k metal gates.

8. A method, comprising:

forming a stack over a substrate, the stack having first and second semiconductor layers alternatingly stacked, the first semiconductor layers having a first semiconductor material, the second semiconductor layers having a second semiconductor material that is different from the first semiconductor material;

patterning the stack and a top portion of the substrate to form a fin-shape structure, the fin-shape structure including a base fin and the patterned first and second semiconductor layers over the base fin;

depositing an isolation structure on sidewalls of the base fin;

forming a dummy gate stack over a channel region of the fin-shape structure;

depositing fin sidewall spacers on sidewalls of the fin-shape structure in a source/drain (S/D) region of the fin-shape structure;

recessing the fin-shape structure in the S/D region to form an S/D trench;

performing an etching process to form gaps vertically between the fin sidewall spacers and the isolation structure;

forming protective dielectric structures in the gaps; and epitaxially growing an S/D feature in the S/D trench, the S/D feature laterally stacked between the protective dielectric structures.

9. The method of claim 8, further comprising:

depositing an etch stop layer covering and in direct contact with the isolation structure, the protective dielectric structures, and the S/D feature.

10. The method of claim 8, wherein the recessing of the fin-shape structure removes the patterned first and second semiconductor layers from the S/D region and recesses a top surface of the base fin, and wherein the etching process recesses a top surface of the isolation structure to a position below the recessed top surface of the base fin.

11. The method of claim 8, wherein the gaps expose the sidewalls of the base fin.

12. The method of claim 8, wherein prior to the performing of the etching process, the fin sidewall spacers are in direct contact with a top surface of the isolation structure.

13. The method of claim 12, wherein after the performing of the etching process, the fin sidewall spacers are spaced apart from the top surface of the isolation structure.

14. The method of claim 8, wherein the forming of the protective dielectric structures includes:

depositing a dielectric blanket in the S/D trench and covering sidewalls of the fin sidewall spacers and a top surface of the isolation structure, the dielectric blanket filling the gaps; and performing a trimming process to the dielectric blanket such that portions of the dielectric blanket outside of the gaps are substantially removed.

15. The method of claim 8, wherein the protective dielectric structures have a thickness ranging from about 5 nm to about 10 nm.

16. The method of claim 8, wherein the protective dielectric structures are a multi-layer structure having at least two dielectric layers of different dielectric material compositions.

17. The method of claim 8, further comprising:

removing the dummy gate stack and the second semiconductor layers to form a gate trench; and depositing a metal gate structure in the gate trench, the metal gate structure wrapping around each of the first semiconductor layers.

18. A method, comprising:

providing a structure having a substrate, first and second fin structures protruding from the substrate, and an isolation structure over the substrate and laterally between the first and second fin structures;

forming a dummy gate stack across the first and second fin structures;

depositing fin sidewall spacers on sidewalls of the first and second fin structures;

recessing the first and second fin structures;

recessing a portion of the isolation structure directly under the fin sidewall spacers to form gaps vertically between the fin sidewall spacers and the isolation structure;

depositing a dielectric layer over the isolation structure and the fin sidewall spacers, the dielectric layer filling the gaps;

removing portions of the dielectric layer outside of the gaps, such that other portions of the dielectric layer remain in the gaps as protective dielectric structures above the isolation structure;

growing epitaxial features from the recessed first and second fin structures, the epitaxial features sandwiched by the protective dielectric structures; and replacing the dummy gate stack with a metal gate structure.

19. The method of claim 18, wherein the protective dielectric structures are free from a central region of a top surface of the isolation structure between the first and second fin structures.

20. The method of claim 18, wherein the protective dielectric structures are above the recessed first and second fin structures.

* * * * *